United States Patent
Clark et al.

(10) Patent No.: US 11,424,744 B2
(45) Date of Patent: *Aug. 23, 2022

(54) MULTI-PURPOSE INTERFACE FOR CONFIGURATION DATA AND USER FABRIC DATA

(71) Applicant: Intel Corporation, Santa Clara, CA (US)

(72) Inventors: Kevin Clark, San Jose, CA (US); Scott J. Weber, Piedmont, CA (US); James Ball, San Jose, CA (US); Ravi Prakash Gutala, San Jose, CA (US); Aravind Raghavendra Dasu, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/094,612

(22) Filed: Nov. 10, 2020

(65) Prior Publication Data
US 2021/0058085 A1 Feb. 25, 2021

Related U.S. Application Data

(63) Continuation of application No. 16/235,984, filed on Dec. 28, 2018, now Pat. No. 10,833,679.

(51) Int. Cl.
| H03K 19/1776 | (2020.01) |
| G11C 5/02 | (2006.01) |
| G11C 7/10 | (2006.01) |
| H01L 25/065 | (2006.01) |

(52) U.S. Cl.
CPC ........ *H03K 19/1776* (2013.01); *G11C 5/025* (2013.01); *G11C 7/1078* (2013.01); *H01L 25/0657* (2013.01); *H01L 2225/06513* (2013.01)

(58) Field of Classification Search
None
See application file for complete search history.

(56) References Cited

U.S. PATENT DOCUMENTS

| 9,401,190 | B1 | 7/2016 | Tan et al. | |
| 10,833,679 | B2* | 11/2020 | Clark | G11C 7/1078 |
| 2013/0181257 | A1 | 7/2013 | Ngai | |
| 2019/0103872 | A1 | 4/2019 | Clark et al. | |
| 2019/0363717 | A1* | 11/2019 | Swarbrick | G06F 21/76 |

* cited by examiner

*Primary Examiner* — Anh Q Tran
(74) *Attorney, Agent, or Firm* — Fletcher Yoder, P.C.

(57) ABSTRACT

An integrated circuit device may include a programmable fabric die having programmable logic fabric and configuration memory that may configure the programmable logic fabric. The integrated circuit device may also include a base die that may provide fabric support circuitry, including memory and/or communication interfaces. The first die and the second die may be coupled using a multi-purpose interface that may allow communication between the first die and the second die. The multi-purpose interface may allow concurrent access to the base die by the programmable logic fabric and the configuration memory by using multiple channels over the multi-purpose interface.

20 Claims, 18 Drawing Sheets

MULTI-PURPOSE INTERFACE FOR CONFIGURATION DATA AND USER FABRIC DATA

CROSS REFERENCE TO RELATED APPLICATIONS

This application is a continuation of U.S. patent application Ser. No. 16/235,984, entitled "MULTI-PURPOSE INTERFACE FOR CONFIGURATION DATA AND USER FABRIC DATA," filed Dec. 28, 2018, which is hereby incorporated by reference in its entirety for all purposes.

BACKGROUND

This disclosure relates to interfaces for transfer of data in a multi-dimensional programmable logic device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. To that end, programmable logic devices may include circuitry for sending and receiving data. For example, a programmable logic device may include programmable logic elements programmed by a form of memory known as configuration random access memory (CRAM). To program a circuit design into a programmable logic device, the circuit design, which may be compiled into a bitstream, is transmitted and loaded into CRAM cells. Once programmed (e.g., with the bitstream), the programmable logic device may perform operations associated with the circuit design. Operations may, among other things, include data transmission and/or data reception. As such, programmable logic devices may perform operations (e.g., configuration operations, logic operations) that may include data exchange.

The highly flexible nature of programmable logic devices makes them an excellent fit for accelerating many computing tasks. Thus, programmable logic devices are increasingly used as accelerators for networking, storage, data center systems, communications, mobile applications, machine learning, video processing, voice recognition, image recognition, and many other highly specialized tasks, particularly those that would be too slow or inefficient in software running on a processor. As the computing tasks performed by the programmable logic devices become more complex, more flexible and faster interfaces for data exchange processes may be of benefit.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
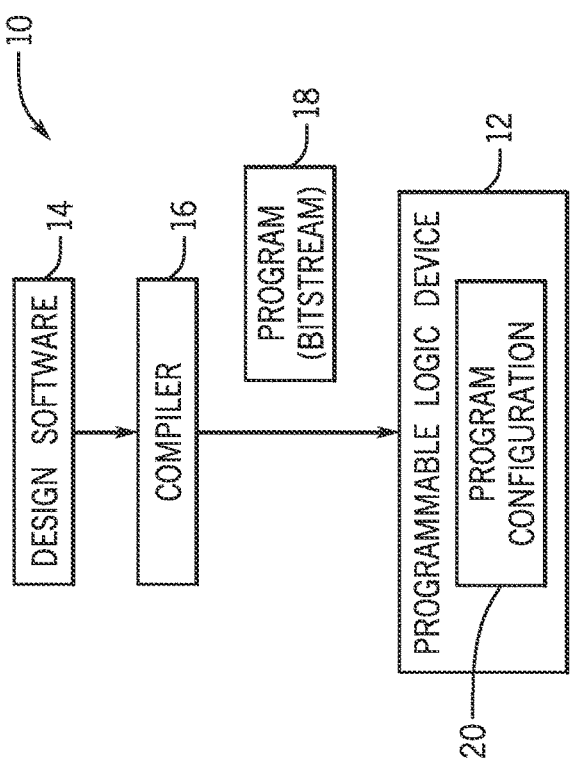
FIG. 1 is a block diagram of a programmable logic device that is programmed with a circuit design, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes them an excellent fit for accelerating many computing tasks. Programmable logic devices are devices that may include customizable and reprogrammable circuitry that can perform digital operations and/or logic functions. To that end, programmable logic devices may be programmed by loading configuration data into configuration memory (e.g., configuration random access memory (CRAM)) that may be embedded in the programmable fabric. The configuration memory may store a logic design (e.g., state machines, truth tables, functions, etc.) that may control configurable logic circuitry to facilitate performance of the programmed tasks. The flexibility in the operations of programmable logic devices also allows reprogramming of the configuration memory (e.g., programming a portion of a circuit design). For example, a system using programmable logic devices may change context (e.g., change the type of operation performed) by loading new configuration data to the configuration memory. Due to the flexibility afforded by the customizable and reconfigurable design, programmable logic devices are increasingly used as accelerators for machine learning, video processing, voice recognition, image recognition, and many other highly specialized tasks, particularly those that would be too slow or inefficient in software running on a processor. As the complexity of the tasks increase, the dimensions of the configuration data also increase, and may benefit from a high-speed interface for loading configuration memory.

As discussed above, programmable circuitry in the programmable logic device (e.g., configuration memory, programmable logic elements, and embedded memory) may send and receive data (e.g., configuration data, user data, incoming data for processing by the programmable logic elements, data processed by the programmable logic data elements). In order to exchange data with external circuitry or other programmable circuitry in the programmable logic device, the device may include high-speed interfaces. A high-speed interface may be used to increase the speed of the programming and/or reprogramming operations, which may reduce the amount of idle time during which the reprogramming tasks is taking place. The high-speed interface may also be used to increase the speed of data transfer from the programmable logic elements, to facilitate data processing operations. Moreover, programmable logic devices may also have user memory that may be directly accessed by the interface. Direct access to the user memory may facilitate diagnostic operations, such as during debugging, testing, or emulation of a system design, direct and fast access to the user memory may increase the speed of diagnostic tasks.

With the foregoing in mind, the embodiments described herein are related to high-speed interfaces that may be used to read or write data into programmable circuitry in programmable logic devices. As discussed herein programmable circuitry may include embedded memory, such as configuration memory (e.g., CRAM), user memory (e.g., embedded random access memory (ERAM), M20K), and/or programmable fabric, such as intellectual property (IP) blocks, programmable logic elements, and other circuits implemented in the programmable fabric. In the present discussion, configuration data refers to data that may be loaded into the configuration memory or other embedded memory, and fabric data refers to data that is exchanged with the programmable fabric.

In certain embodiments, the programmable logic device may be composed of at least two separate die. The programmable logic devices may include a first die that contains the programmable circuitry and a second die that contains fabric support circuitry, such as memory and/or communication interfaces. The first die and the second die may be coupled via a high-speed interface that allows multi-purpose data exchange between the dies, and both the first die and the second die may include interface control circuitry. In order to provide access to different parts of the programmable circuitry, and in order to allow efficient data exchange with different data types (e.g., configuration data, fabric data, fabric data employing multiple protocols), the high-speed interface may implement multiple channels. Moreover, the channels may operate at any frequency and/or clocking technique to match the number of microbumps in a channel and the bandwidth of the internal bus. The high-speed interface may be used to transport configuration data and/or fabric data. The high-speed interface may be implemented using a 2.5D or a 3D connection. The coupling through the interface may take place via a high-density connection (e.g., microbumps).

In some systems, in some embodiments the programmable logic die may be sectorized, as detailed below. In such systems, the fabric support circuitry in the base die may include network on chip (NOC) circuitry to send and/or receive data (e.g., configuration data, user data) with systems external to the programmable device and/or between sectors in the programmable devices. The fabric support circuitry may also include sector-aligned memory. In some embodiments, the sector-aligned memory may operate as a temporary storage (e.g., cache) for the configuration data or user memory. By incorporating the NOC into the fabric support circuitry, the NOC may resolve periphery shoreline bandwidth issues of the fabric, while increasing the bandwidth of the fabric. In addition, the communication routes available via the NOC embedded in the fabric support circuitry may enable the fabric to implement design relocations or reconfigurations, provide alternate pathways around powered-down sectors of the fabric, and provide security isolation features. The NOC may be a source of configuration data and/or fabric data and may be integrated to access the multi-purpose high-speed interface.

In addition to the above-described features, the fabric support circuitry may include, among other things, a device controller (sometimes referred to as a secure device manager (SDM)), a sector controller (sometimes referred to as a local sector manager (LSM), region controller), a configuration network on chip (CNOC), data routing circuitry, local (e.g., sectorized, sector-aligned, region-aligned) memory used to store and/or cache configuration programs (bitstreams) or data, memory controllers used to program the programmable logic fabric, input/output (110) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, or electrostatic discharge circuitry, to name just a few circuit elements that may be present on the second die.

By way of introduction, FIG. 1 illustrates a block diagram of a system 10 that may employ a programmable logic device 12 that can communicate via a network-on-chip disposed on a separate die that does not include programmable logic fabric, in accordance with embodiments presented herein. Using the system 10, a designer may implement a circuit design functionality on an integrated circuit, such as a reconfigurable programmable logic device 12, such as a field programmable gate array (FPGA).

The designer may implement a circuit design to be programmed onto the programmable logic device 12 using design software 14, such as a version of Intel® Quartus® by Intel Corporation of Santa Clara, Calif. The design software 14 may use a compiler 16 to generate a low-level circuit-design defined by bitstream 18, sometimes known as a program object file and/or configuration program, which programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may, in some cases, represent an accelerator function to perform machine learning functions, video processing functions, voice recognition functions, image recognition functions, networking functions, or other highly specialized task.

To carry out the systems and methods of this disclosure, the programmable logic device 12 may take any suitable form that includes the multi-purpose high-speed parallel interface, which increases the speed of exchange of fabric data and/or configuration data across different portions (e.g., sectors, dies) of the programmable logic device 12. The multi-purpose parallel interface may also allow reconfiguration of portions of the programmable logic device 12 while concurrently operating a circuit design by allowing concurrent exchange of fabric data and configuration data through distinct microbump channels. As such, in one embodiment, the programmable logic device 12 may have two separate integrated circuit die coupled via the multi-purpose parallel interface. The integrated circuit dies may include controllers for the multi-purpose parallel interface, which may be hard coded circuitry, a soft IP block, and/or custom logic.

Figure 2:
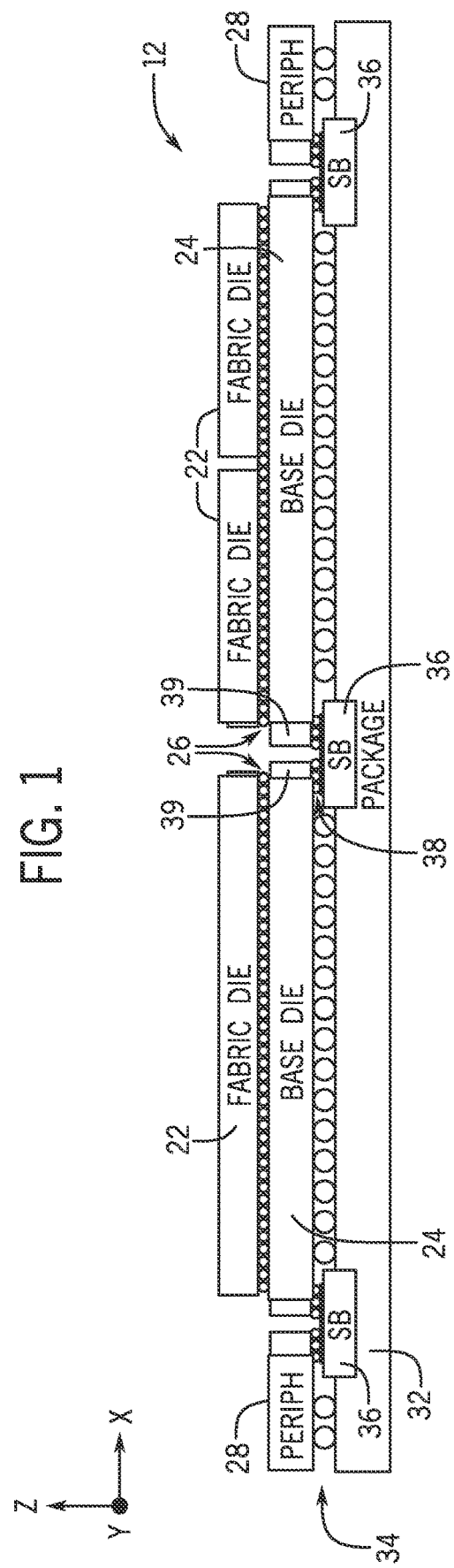
FIG. 2 is a block diagram of a package including the programmable logic device where a fabric die is vertically stacked with a base die and coupled through a multi-purpose parallel configuration interface, in accordance with an embodiment.

One example of the programmable logic device 12 is shown in FIG. 2, but any suitable programmable logic device may be used. In the example of FIG. 2, the programmable logic device 12 includes a fabric die 22 and a base die 24 that are connected to one another via microbumps 26. The microbumps 26 may couple an interface in the fabric die 22 (e.g., an FPGA microbump interface (FMIB)) to an interface in the base die 24 (e.g., a base microbump interface (BMIB)), as detailed below. In the illustrated diagram of FIG. 2, the fabric die 22 and base die 24 are illustrated in a one-to-one relationship and in an arrangement in which a single base die 24 may attach to several fabric die 22. Other arrangements, such as an arrangement in which several base die 24 may attach to a single fabric die 22, or several base die 24 may attach to several fabric die 22 (e.g., in an interleaved pattern along the x- and/or y-direction) may also be used. Peripheral circuitry 28 may be attached to, embedded within, and/or disposed on top of the base die 24. The base die 24 may attach to a package substrate 32 via C4 bumps 34. In the example of FIG. 2, two pairs of fabric die 22 and base die 24 are shown communicatively connected to one another via a silicon bridge 36 (e.g., an embedded multi-die interconnect bridge (EMIB)) and microbumps 38 at a silicon bridge interface 39.

Although the microbumps 26 and the microbumps 38 are described as being employed between the fabric die 22 and the base die 24 or between the edge devices, such as the silicon bridge 36 and the silicon bridge interface 39, it should be noted that microbumps may be employed at any suitable position between the components of the programmable logic device 12. For example, the microbumps may be incorporated in any suitable position (e.g., middle, edge, diagonal) between the fabric die 22 and the base die 24. In the same manner, the microbumps may be incorporated in any suitable pattern or amorphous shape to facilitate interconnectivity between various components (e.g., NOC) described herein.

Figure 3:
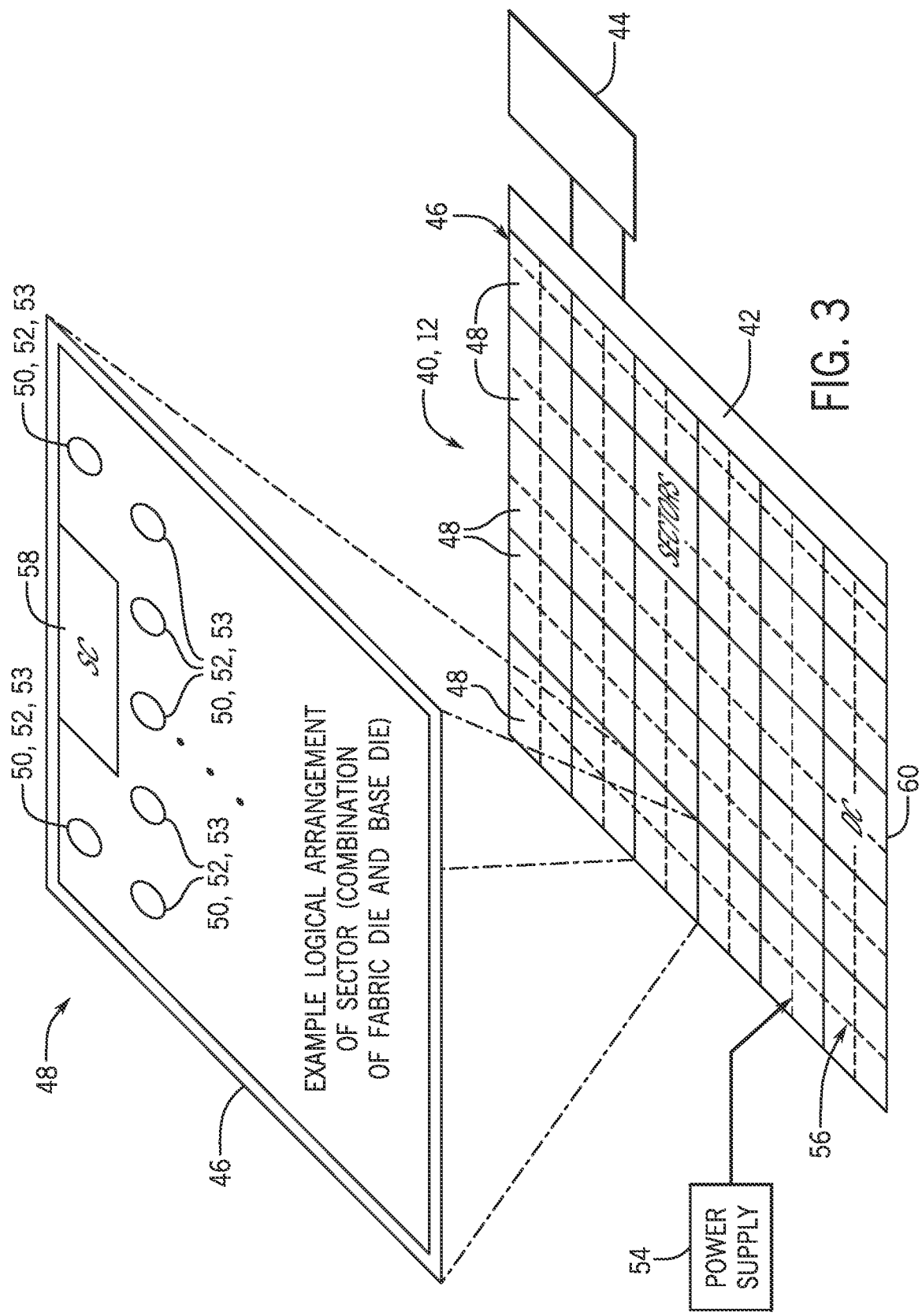
FIG. 3 is a block diagram of an example logical arrangement of the programmable logic device, in accordance with an embodiment.

In combination, the fabric die 22 and base die 24 may operate as a programmable logic device such as a field programmable gate array (FPGA) device. For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when both the fabric die 22 and the base die 24 operate in combination. That is, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit and/or application-specific standard product).

In the example of FIG. 3, the FPGA 40 may include transceiver circuitry 44 for driving signals off of the FPGA 40 and for receiving signals from other devices. The transceiver circuitry 44 may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48 (e.g., region, portion).

Each programmable logic sector 48 may include a number of programmable logic elements 50 (also referred herein as FPGA fabric) having operations defined by configuration memory 52 (e.g., configuration random access memory (CRAM)). The programmable logic elements 50 may include combinatorial or sequential logic circuitry. For example, the programmable logic elements 50 may include look-up tables, registers, multiplexers, routing wires, and so forth. A designer may program the programmable logic elements 50 to perform a variety of desired functions. The programmable logic sector 48 may also include user memory 53. User memory may be in the form of embedded random access memory (ERAM), and/or memory blocks, such as M20K. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while the illustrated system includes 29 programmable logic sectors 48 are shown here, it should be appreciated that more or fewer may appear in an actual implementation (e.g., in some cases, on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60 and may read data from and write data into its configuration memory 52 or user memory 53 based on control signals from the device controller 60. To that end and, as detailed below, the device controller may employ a data register (DR) and/or an address register (AR) to access data from the configuration memory 52 or user memory 53.

In addition to these operations, the sector controller 58 and/or device controller 60 may be augmented with additional capabilities. As described herein, a high-speed parallel interface may be used to coordinating memory transactions between local in-fabric memory (e.g., local fabric memory or CRAM being used for data storage) and sector-aligned memory associated with that particular programmable logic sector 48. Moreover, a NOC may be used to facilitate memory transactions between multiple sectors, multiple dies, and between the programmable logic device and external systems, as discussed herein. NOC may further be employed for decrypting configuration data (bitstreams) 18, and for locally sequencing reads and writes to implement error detection and correction on the configuration memory 52 or user memory 53, and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes," and the local controller may be placed into any of those modes. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Sector controller 58 may include circuitry to manage the high-speed parallel interface (e.g., DR Intercept interface (DRIP)). The high-speed parallel interface may allow fast loading of DR circuitry, which may be used for configuration operations (e.g., CRAM operations), user memory operations (e.g., ERAM operations), and/or test (e.g., scan chains operations). For example, a high-speed interface controller (e.g., DRIP Controller), located in a fabric die, and a base die DRIP Controller, located in a base die, may be used to coordinate operations in the microbump interface, and may be part of the sector controller 58. The DRIP controllers and the NOC circuitry may also coordinate operations to perform multi-sector high-speed data exchange between base die and fabric die. Each sector controller 58 thus may communicate with the device controller 60, which may coordinate the operations of the sector controllers 58 and convey commands initiated from outside the FPGA 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data is loaded into the configuration memory 52 using pins to transceiver circuitry 44 and input/output circuitry 42. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may be applied to configure the gates of metal-oxide-semiconductor (MOS) transistors that control the states of the programmable logic elements 50 or programmable components of the interconnection resources 46.

Figure 4:
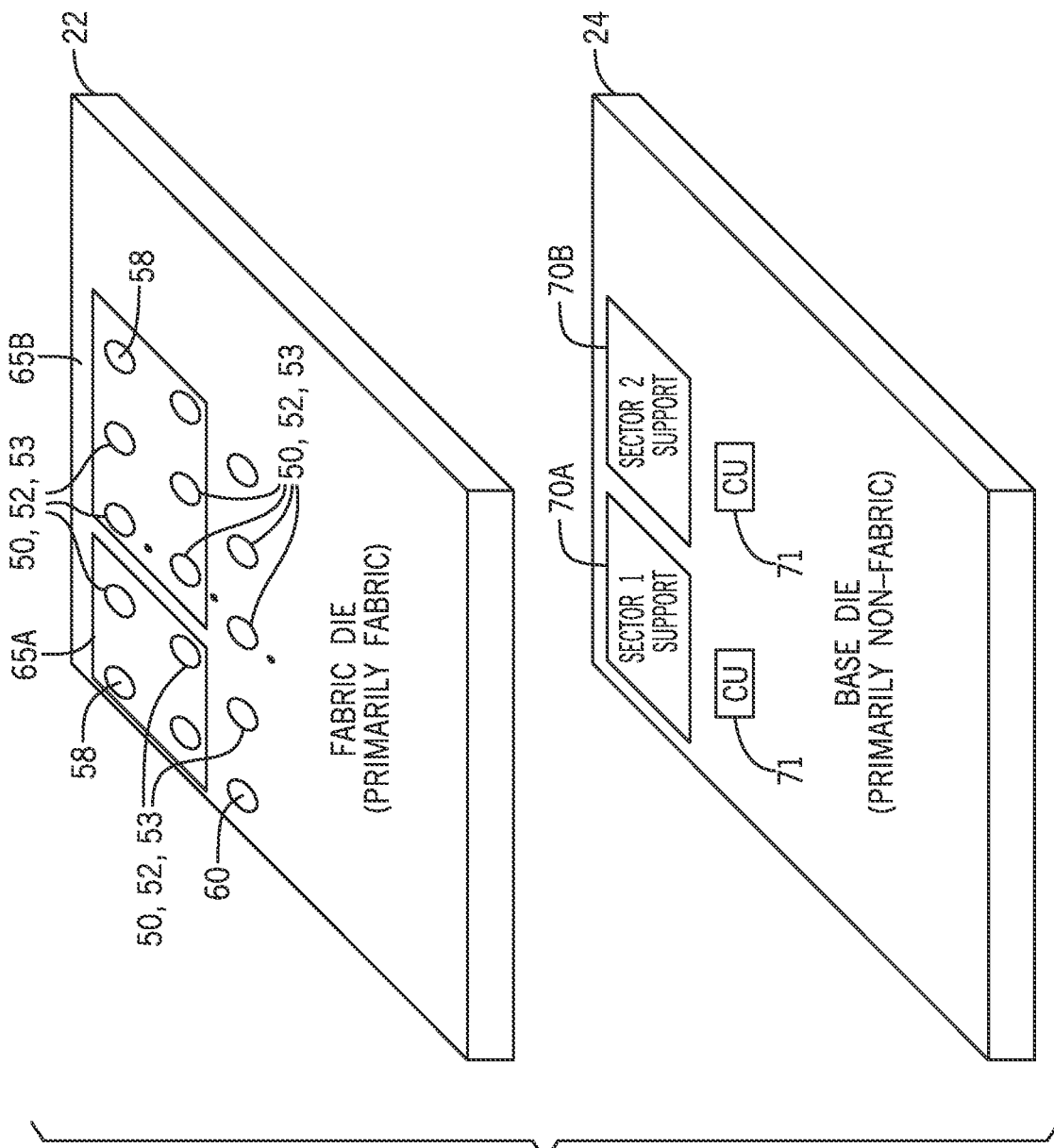
FIG. 4 is a block diagram showing a fabric die of the programmable logic device that contains programmable logic fabric with embedded memory and a base die of the programmable logic device that contains non-fabric circuitry that support operations of the fabric die, in accordance with an embodiment.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50, configuration memory 52, and user memory 53, and may be arranged in sectors such as sectors 65A and 65B. In some cases, this may also entail certain fabric control circuitry such as the sector controller (SC) 58 or device controller (DC) 60. The base die 24 may include supporting circuitry to operate the programmable logic elements 50, configuration memory 52, and user memory 53. As an example, the programmable logic elements 50 may exchange fabric data with the supporting circuitry in the base die 24 and configuration memory may exchange configuration data with the supporting circuitry in the base die 24. As shown here, the base die 24 includes support circuitry 70A, which may support fabric sector 65A, and support circuitry 70B, which may support fabric sector 65B. The base die 24 may also include support circuitry for other sectors of the fabric die 22.

Figure 5:
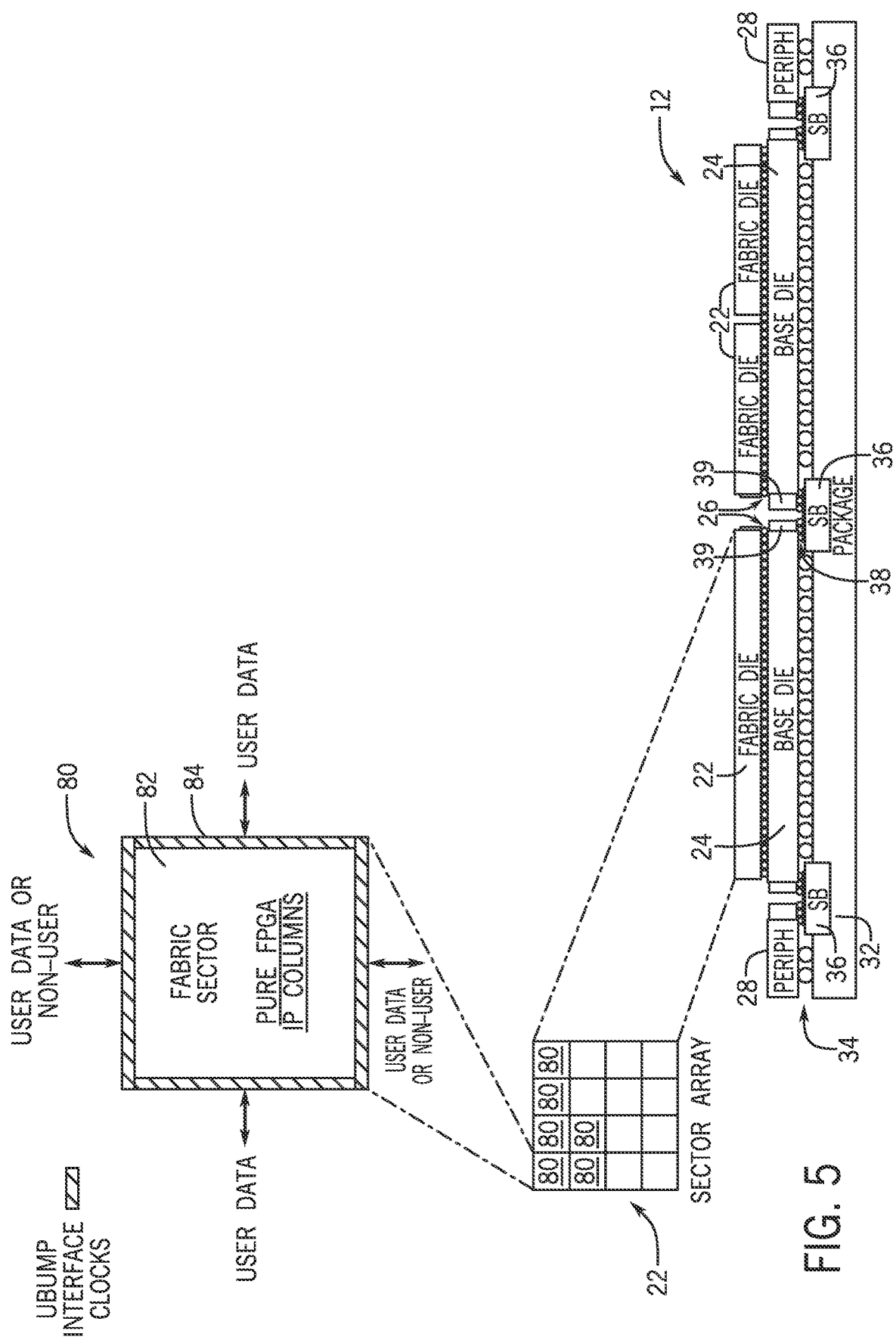
FIG. 5 is a block diagram of an example topology of the fabric die having circuitry for a multi-purpose parallel interface, in accordance with an embodiment.
Figure 6:
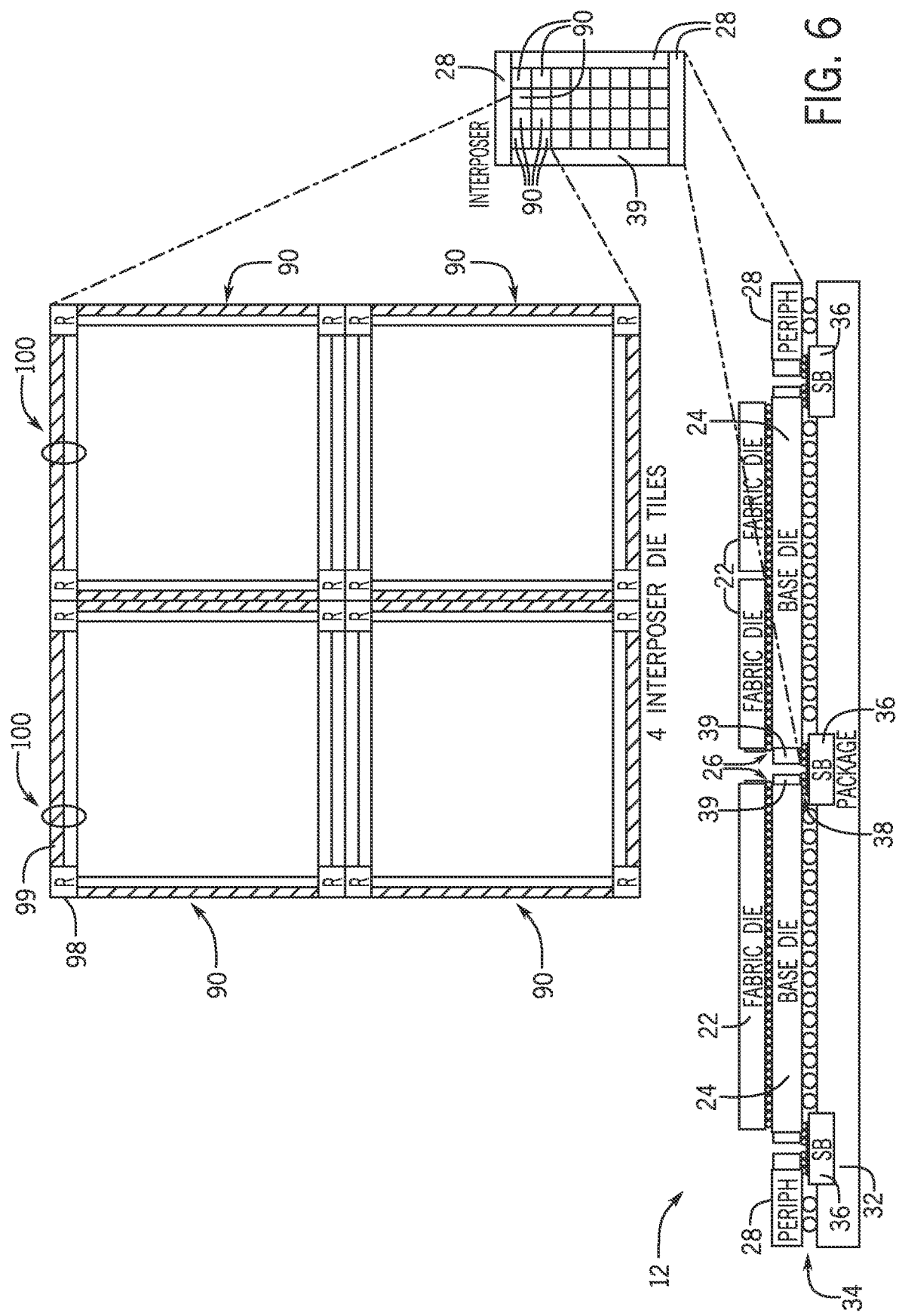
FIG. 6 is a block diagram of an example topology of the base die having an embedded network-on-chip (NOC) and of circuitry for a multi-purpose parallel interface, in accordance with an embodiment.

As discussed above, the multi-purpose interface may benefit from the presence of NOC circuitry in the base die (e.g., base die 24). The block diagrams in FIGS. 5, 6, 7, and 8 illustrate an example of a physical arrangement of the fabric die 22 and the base die 24 that may implement a NOC system. For example, a physical arrangement of the fabric die 22 and the base die 24 is shown by FIGS. 5 and 6. In FIG. 5, the fabric die 22 is shown to contain an array of fabric sectors 80 that include fabric resources 82 (e.g., programmable elements programmed by CRAM and/or certain fabric control circuitry such as the sector controller (SC) 58 or device controller (DC) 60) and interface circuitry 84. The interface circuitry 84 may include data routing and/or clocking resources or may include an interface to data routing and/or clocking resources on the base die 24. Thus, the interface circuitry 84 may connect with a microbump (µbump) interface to connect to the base die 24.

FIG. 6 provides an example complementary arrangement of the base die 24. The base die 24 may represent an active interposer with several sectors 90 surrounded by peripheral circuitry 28 and the silicon bridge interface 39. Although not shown in FIG. 6, each sector 90 may include a variety of fabric support circuitry, which may described in greater detail below. In any case, the base die 24, in some embodiments, may include data and/or configuration routers 98, and/or data or configuration pathways 99. In some embodiments, portions of the data or configuration pathways 99 may communicate data in one direction, while other portions may communicate data in the opposite direction. In other embodiments, the data or configuration pathways 99 may communicate data bi-directionally.

With the foregoing in mind, the data and/or configuration pathways 99 may make up a network on chip (NOC) system 100. In the embodiment depicted in FIG. 6, the NOC system 100 may be integrated between each sector 90 of the base die 24. As such, the NOC system 100 may enable each of the sectors 90 disposed on the base die 24 to be accessible to each other. Indeed, the NOC system 100 may provide communication paths between each sector 90 via routers 98 or the like. In certain embodiments, the routers 98 may route user data between sectors 90 of the base die 24, to sectors 48 of the fabric die 22, and the like. Since the base die 24 is separate from the fabric die 22, the NOC system 100 may be continuously powered on, even when various sectors 48 of the fabric die 22 are powered down. In this way, the NOC system 100 of the base die 24 may provide an available route to different sectors 48 of the fabric die 22 regardless of the positions of powered down sectors 48.

In some embodiments, the NOC system 100 may include features such as Quality of Service management, Security Management, Debug and Performance measurement and Address virtualization services, and the like. In addition, the NOC system 100 may support caching features and interconnect protocols allowing the memory components of the programmable logic device 12 to be part of a coherent memory system supported by a caching agent.

By vertically aligning the fabric die 22 and the base die 24, the NOC 100 disposed on the base die 24 may physically span across the same surface area of the fabric die 22. In certain embodiments, microbumps may be positioned at various locations between the base die 24 and the fabric die 22 to enable the NOC 100 to communicate data between sectors 90 of the base die and sectors 48 of the fabric die 22. In the example embodiment of the NOC 100 depicted in FIG. 6, the NOC 100 may be positioned around each sector 90, which may be aligned with a corresponding sector 48 of the fabric die 22. As such, the NOC 100 may provide additional horizontal and vertical routing wires or pathways to facilitate communication between sectors 48 of the fabric die 22, between sectors 90 of the base die 24, or between sectors 48 of the fabric die 22 and sectors 90 of the base die 24. The additional horizontal and vertical lines provided by the NOC 100 may reduce the amount of quantization performed by the programmable logic device 12.

Figure 7:
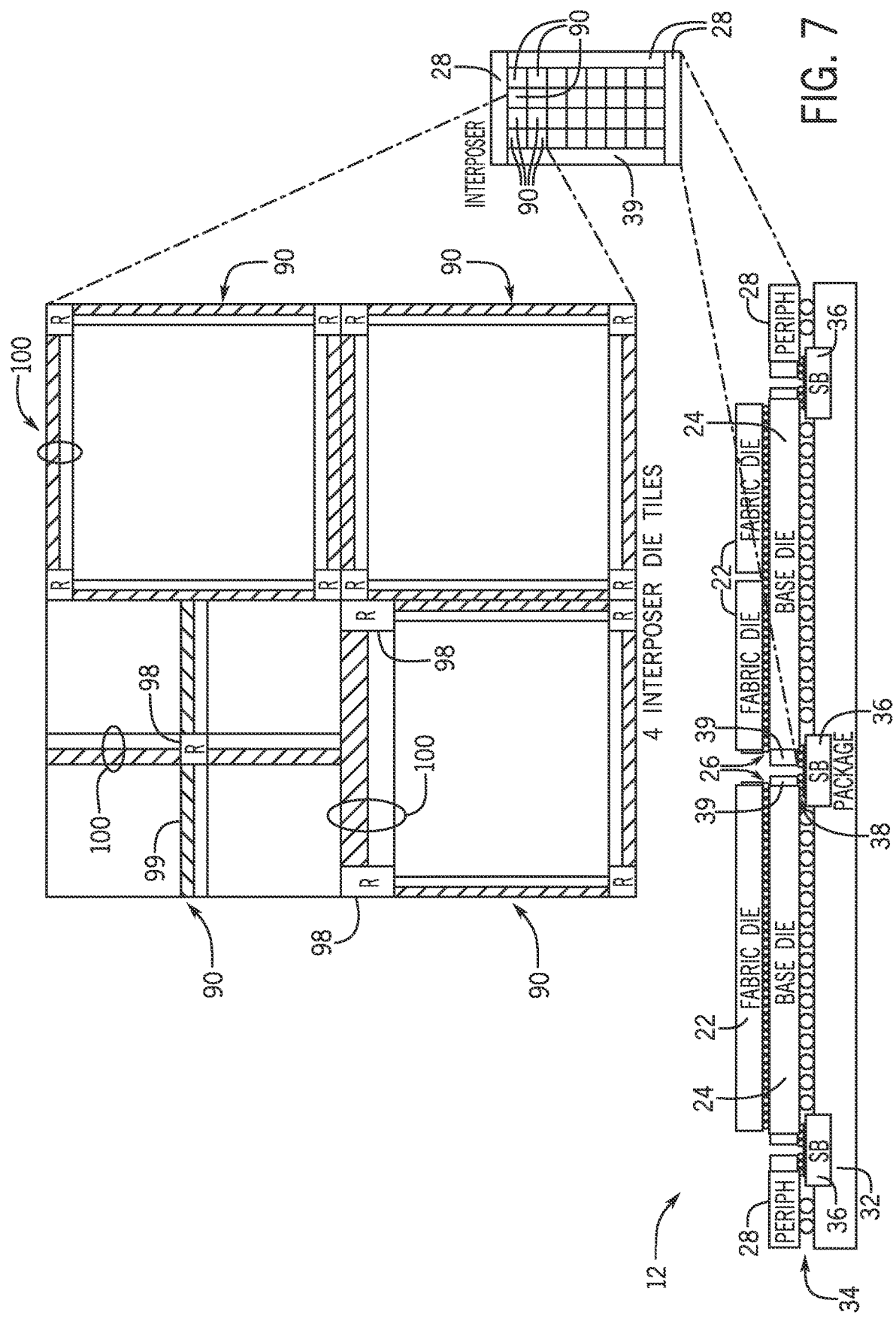
FIG. 7 is a block diagram of an example topology of the base die having circuitry for a multi-purpose parallel interface and a different configuration of the embedded NOC, in accordance with an embodiment.

Although the data or configuration pathways 99 of the NOC 100 is illustrated in FIG. 6 as being routed around the sectors 90 of the base die 24, it should be noted that data or configuration pathways 99 of the NOC 100 may be routed across the base die 24 in any suitable manner. By way of example, FIG. 7 illustrates the NOC 100 implemented with data or configuration pathways 99 disposed across the center of the sector 90. As such, the router 98 may also be positioned in the center of the sector 90.

In addition, in some embodiments, the data or configuration pathways 99 of the NOC 100 may be wider in certain sectors 90 as compared to other sectors 90. In any case, it should be understood that the data or configuration pathways 99 may be incorporated into the base die 24, such that serve desired functions or operations that may be specific to the operations performed by the programmable logic device 12. That is, if the programmable logic device 12 includes functions that involve regularly transferring data across the fabric die 22, it may be beneficial to use more of the base die 24 space to include data or configuration pathways 99 that take up more space on the base die 24 to provide increased bandwidth.

With the foregoing in mind, the NOC system 100 may include the data or configuration pathways 99 that allow for efficient multi-dimensional (e.g., three-dimensional, two-dimensional) integration of the NOC system 100 on the programmable logic device 12. Indeed, the NOC system 100 may enable the fabric die 22 to connect to the peripheral circuitry 28 and other parts of the fabric without communicating via the fabric die 22 or the programmable logic sectors 48 of the fabric die 22. That is, by employing the NOC system 100 in the base die 24, the programmable logic device 12 may increase the available bandwidth for communication across the programmable logic sectors 48 because the NOC system 100 provides additional pathways to different parts of the programmable logic device 12.

Figure 9:
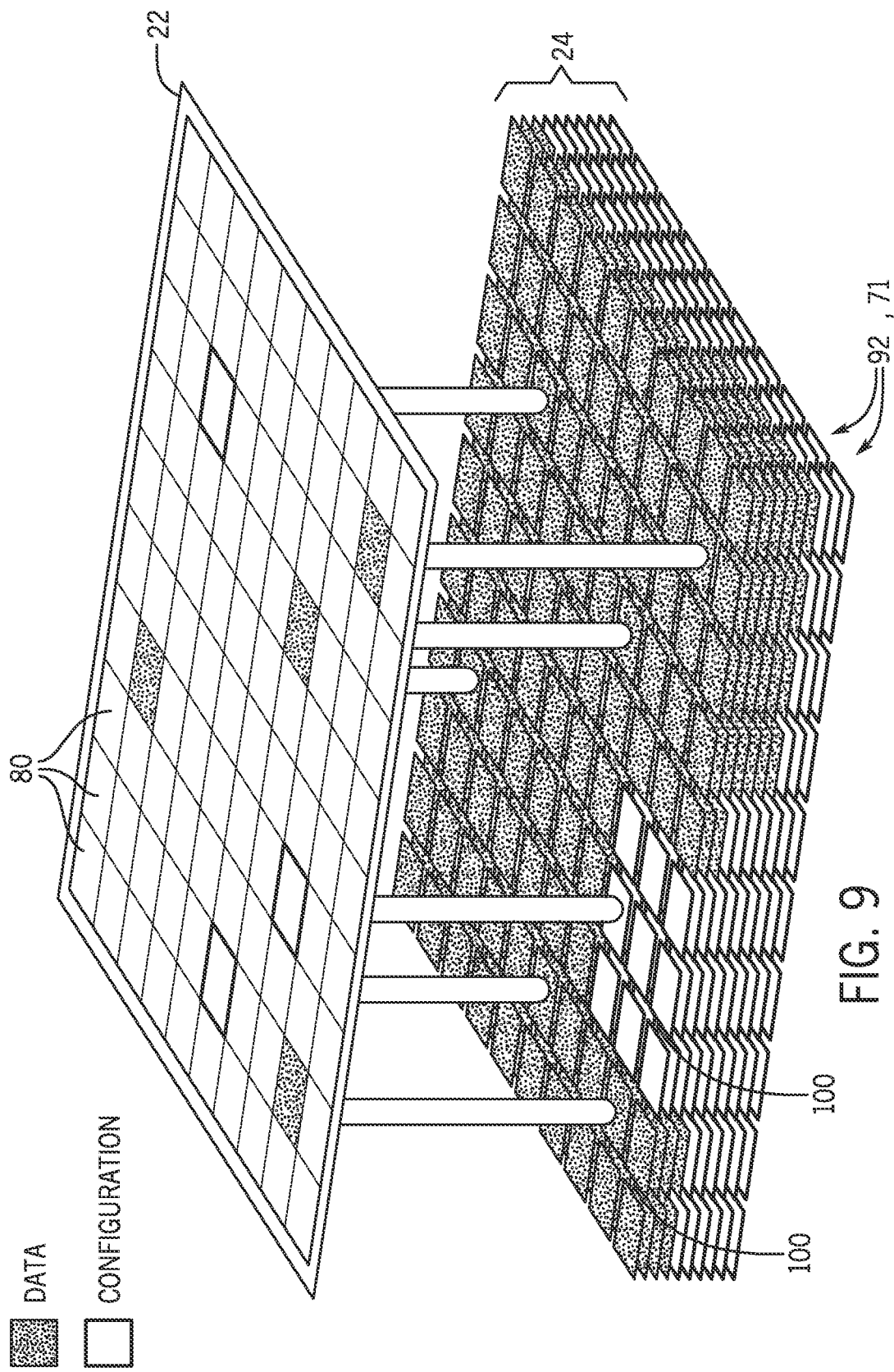
FIG. 9 is a block diagram of sector-aligned memory having embedded NOC circuitry integrated with a sector-aligned memory and configurable to exchange data with the programmable logic die via the multi-purpose parallel interface, in accordance with an embodiment.

In addition, the NOC 100 resolves shoreline issues, supports fast reconfiguration, and enables relocate-ability of functions in the programmable logic sectors 48 based on the increased bandwidth and accessibility to different portions of the fabric die 22 via the base die 24. That is, as shown in FIG. 9, the NOC system 100 may be integrated with the sector-aligned memory 92 of the base die 24, such that it spans across the entire base die 24. As such, the NOC system 100 may access different fabric sectors 80 through various routes in the base die 24. In addition, the additional routes enable the NOC system 100 to serve as functional bypass around powered down sectors 80 without affecting the performance of the programmable logic device 12 by avoiding blockages across the programmable logic sectors 48 of the programmable logic device 12. That is, in some situations, certain sectors 80 of the fabric die 22 may be powered down, thereby preventing communication across the powered down sectors 80. In this case, the NOC system 100 may provide alternate communication pathways around the powered down sectors 80 to maintain communicative connectedness across the sectors 80 of the fabric die 22 regardless of whether certain sectors 80 are powered down.

The design relocate-ability of the programmable logic sectors 48 is also enhanced by the NOC system 100 because the NOC system 100 may access different sectors 80 of the fabric die 22. That is, the increased communication flexibility provided by the NOC system 100 being disposed in the base die 24 enables the programmable logic sectors 48 to be repositioned in various sectors 80 of the fabric die 22, while maintaining communication capabilities between the relocated programmable logic sectors 48.

Although FIGS. 6 and 7 illustrate two embodiments with different configurations for the NOC 100, it should be noted that the base die 24 may be configured to include a data or configuration pathways 99 in a variety of shapes, forms, positions, and the like. For example, the data or configuration pathways 99 of different sectors 90 may overlap each other, the entire sector 90 may incorporate the data or configuration pathway 99, or the like. In addition, microbumps may be used to facilitate communication between the NOC 100 and various sectors 80 of the fabric die 22 and the like.

Figure 8:
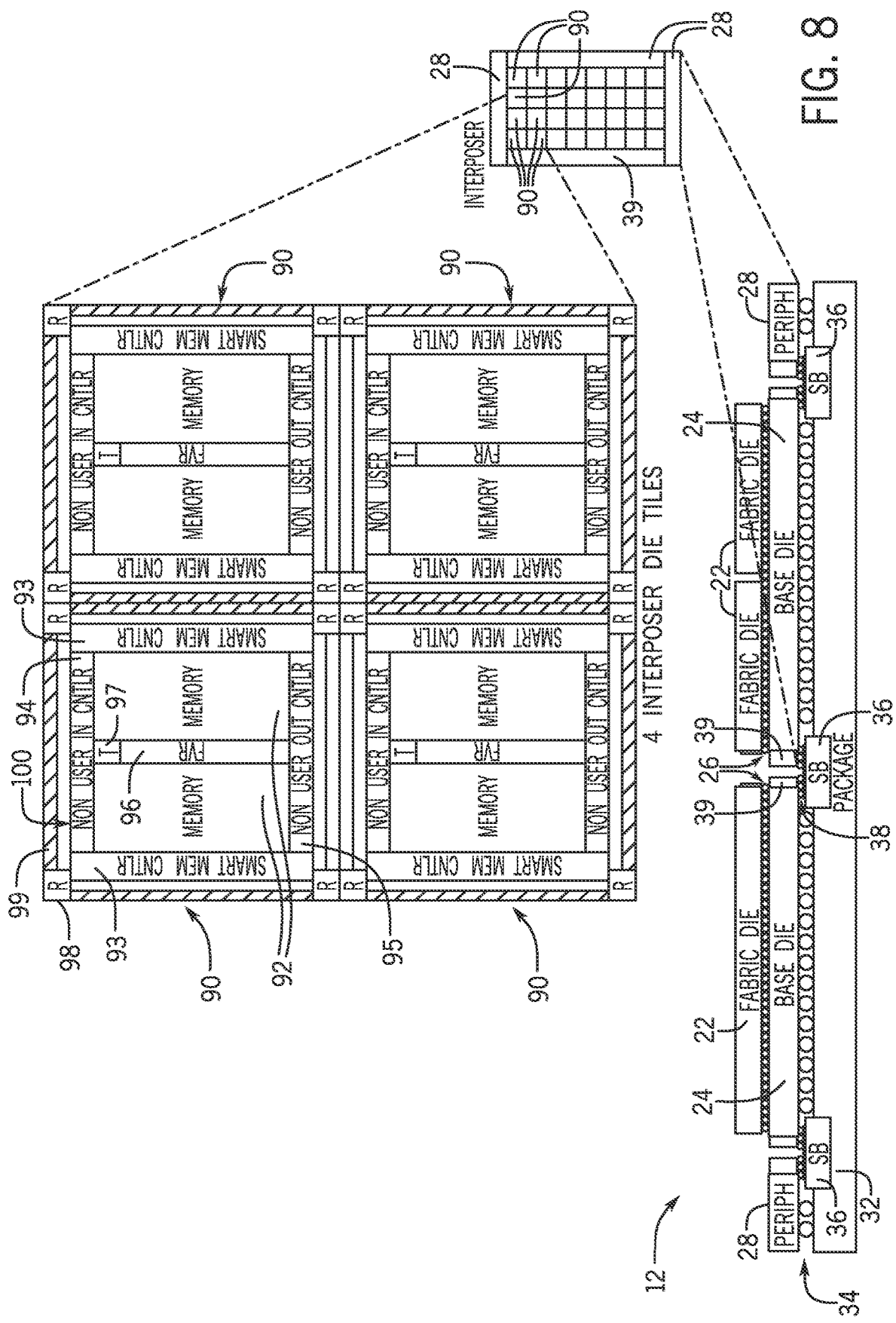
FIG. 8 is a block diagram of an example topology of the base die having circuitry for a multi-purpose parallel interface and an embedded NOC integrated with a sector-aligned memory, in accordance with an embodiment.

In addition to facilitating communication of data between sectors 90, sectors 80, and the like, the presence of the NOC 100 in the base die 24 may also provide the programmable logic device 12 to incorporate additional circuit features by leveraging the NOC 100 of the base die 24 to improve the communication across the fabric die 22. By way of example, FIG. 8 provides another embodiment of an arrangement of the base die 24. Similar to the base die 24 described above, the base die 24 of FIG. 8 may represent an active interposer with several sectors 90 surrounded by peripheral circuitry 28 and the silicon bridge interface 39. As shown in FIG. 8, each sector 90 may include a variety of fabric support circuitry, such as sector-aligned memory 92, memory control circuitry 93, non-user input control circuitry 94, non-user output control circuitry 95, a voltage regulator such as a fully integrated voltage regulator (FIVR) 96, one or more thermal sensors 97, data and configuration routers 98, and/or data or configuration pathways 99.

Although the following description of the additional circuit features enabled by the NOC 100 embedded in the base die 24 focuses on the ability to transfer data to and from the sector-aligned memory 92, it should be noted that the additional circuit features are not limited to technologies involving the sector-aligned memory 92. Indeed, the NOC 100 embedded in the base die 24 may enable a variety of circuit operations to be performed more efficiently and effectively via the programmable logic device 12. However, for the purposes of discussion, certain operations that involve the sector-aligned memory 92 and the NOC 100 will be described to illustrate some of the functions enabled by incorporating the NOC 100 into the base die 24.

Referring back to FIG. 8, the memory control circuitry 93 may be used to program the sector-aligned memory 92, the CRAM of the fabric die 22, or both. The non-user input control circuitry 94 and non-user output control circuitry 95 may allow the circuitry of the sectors 90 to exchange data and/or control signals (e.g., via configurable data routing network-on-chip (NOC) or a configuration network on chip (CNOC)). In one example, the non-user input control circuitry 94 and non-user output control circuitry 95 may operate as the sector controller (SC) 58 for a corresponding fabric sector 80 (as shown in FIG. 5).

The FIVR 96 and the one or more thermal sensors 97 may be used to provide a desired voltage to the corresponding fabric sector 80 (as shown in FIG. 5), enabling the voltage to be selectively scaled up or down, or removed, depending on power and thermal specifications (e.g., based at least in part on temperature as measured by a thermal sensor 97 and/or in accordance with a dynamic voltage and frequency scaling (DVFS) scheme). Even though the thermal sensors 97 are in a separate die from that of the programmable logic fabric elements, when the base die 24 is directly adjacent to the fabric die 22 as in this example, the temperature measured by the thermal sensor 97 in the base die 24 may correspond well enough to the fabric die 22 to allow for temperature-based operations (e.g., turn off power to the corresponding fabric sector 80 to prevent a permanent-denial-of-service (PDOS) condition).

In certain embodiments, the data or configuration pathways 99 that make up the NOC system 100 may provide communication paths between each sector 90 via routers 98 mentioned above. As shown in FIG. 9, by vertically aligning the fabric die 22 and the base die 24 and incorporating the NOC 100 in the base die 24, memory located in the base die 24 may be accessible in parallel to fabric sectors 80 of the fabric die 22. FIG. 9 shows an example in which sector-aligned memory 92 may be contained in the base die 24. The sector-aligned memory 92 may be directly accessible to respective fabric sectors 80 of the fabric die 22 and may contain user data (generated by or accessible by a circuit design programmed into the programmable logic fabric of the base die 24) or configuration data that may be used to program the programmable logic fabric of the base die 24. In this disclosure, "directly accessible" refers to a connection between a region of the sector-aligned memory 92 that is associated with a particular fabric sector 80 and that particular fabric sector 80. In some embodiments, each respective region of the sector-aligned memory 92 associated with a particular fabric sector 80 may be directly accessible to that particular fabric sector 80, thereby providing each fabric sector 80 with direct access to that region of the sector-aligned memory 92. For example, there may be N regions of sector-aligned memory 92 that can be accessible by N corresponding fabric sectors 80 at the same time (e.g., in parallel). In some cases, the sector-aligned memory 92 may be accessible to more than one fabric sector 80 or multiple sectors of sector-aligned memory 92 may be accessible to a single fabric sector 80. Thus, in some cases, the same region of sector-aligned memory 92 may be directly accessible to multiple fabric sectors 80, while in other cases, a region of sector-aligned memory 92 may be directly accessible only to a single fabric sector 80. In the example of FIG. 9, the fabric sectors 80 may access specific regions of sector-aligned memory 92. The sector-aligned memory 92 is shown in FIG. 9 as vertically stacked memory. This may allow a large amount of memory to be located within the base die 24. However, the sector-aligned memory 92 may occupy a single plane of the base die 24 in some embodiments.

It should be noted that the fabric sectors 80 may initiate a transfer of data directly between memory locations of the sector-aligned memory 92 of the base die 24 using the NOC 100, between different fabric sectors 80 of the fabric die 22, between fabric sectors 80 and memory locations of the sector-aligned memory 92, and the like. In certain embodiments, the sector controller (SC) 58 may initiate the transfer of data between sectors 80 of the fabric die 22, between memory locations of the sector-aligned memory 92, between sectors 80 of the fabric die 22 and memory locations of the sector-aligned memory 92, and the like. That is, the sector controller (SC) 58 may coordinate the operation of the NOC 100 to facilitate the transfer of the data between the source and destination targets, as specified by the section controller (SC) 58. In some embodiments, the section controller (SC) 58 may act as a master to initiate the respective transfer and the transfer would then be performed using the NOC 100 after the section controller (SC) 58 initiates the data transfer process.

Figure 10:
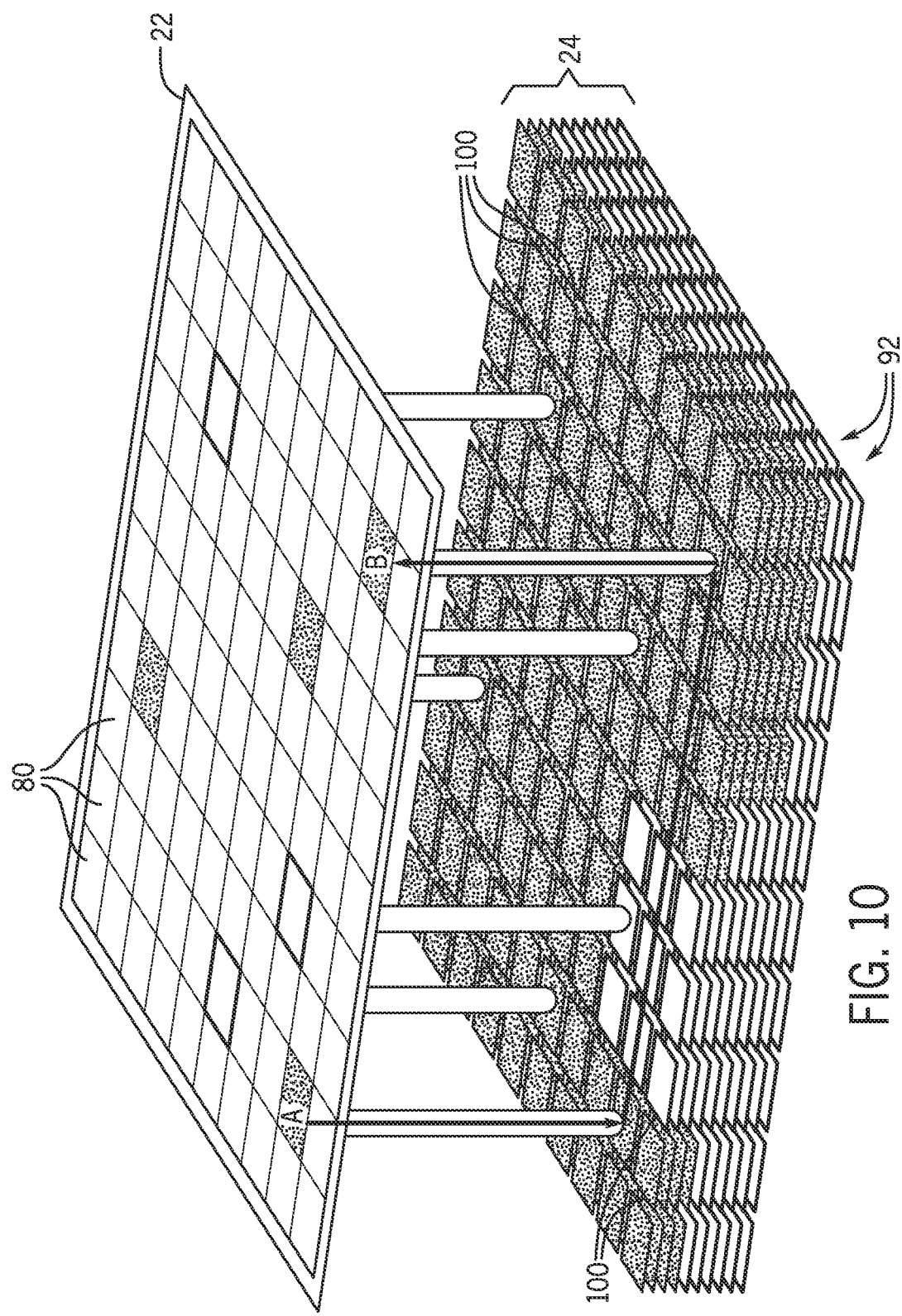
FIG. 10 is a an example of data transfer between sectors of the programmable logic fabric using the system of FIG. 9, in accordance with an embodiment.

By way of example, FIG. 10 includes a block diagram of illustrating the transfer of data between sectors 80 of the programmable logic fabric via the NOC circuitry 100 of the base die 24. Referring to FIG. 10, in one embodiment, the sector controller (SC) 58 may initiate a transfer of data from sector "A" to sector "B" of the fabric die 22 using the NOC 100 of the base die 24. That is, the sector controller (SC) 58 may transfer data to a region of the sector-aligned memory 92 aligned with sector "A" of the fabric die 22, use the NOC 100 to transfer the data to a second region of the sector-aligned memory 92 aligned with sector "B" of the fabric die 22, and transfer the data from the second region of the sector-aligned memory 92 to sector "B" of the fabric die 22. Although the route of the data transfer illustrated in FIG. 10 corresponds to straight paths, it should be noted that the data transferred to different sectors 80 of the fabric die 22 or regions of the sector-aligned memory 92 may use a variety of directions and routes.

Figure 11:
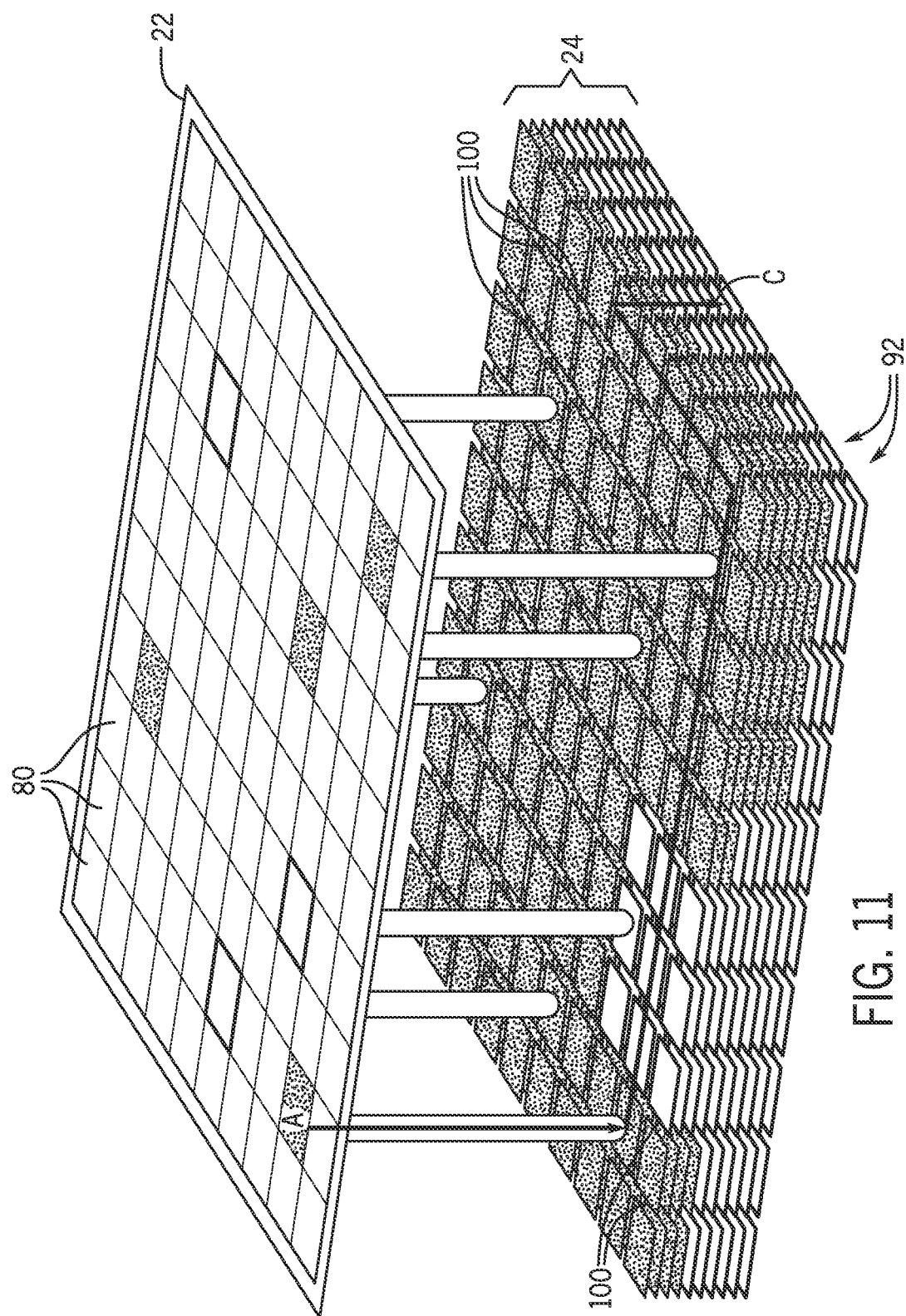
FIG. 11 is an example of data transfer from a sector of the programmable logic fabric to a memory of the sector-aligned memory using the system of FIG. 9.

In another example, FIG. 11 includes a block diagram illustrating the transfer of data from a sector 80 of the programmable logic fabric to a region of the sector-aligned memory 92 via the NOC circuitry 100 of the base die 24. Referring to FIG. 11, in one embodiment, the sector controller (SC) 58 may initiate a transfer of data from sector "A" of the fabric die 22 to region "C" of the sector-aligned memory 92 using the NOC 100 of the base die 24. That is, the sector controller (SC) 58 may transfer data to a first region of the sector-aligned memory 92 aligned with sector "A" of the fabric die 22 and use the NOC 100 to transfer the data to region "C" of the sector-aligned memory 92 via different regions of the sector-aligned memory 92 or the like. Like FIG. 10, although the route of the data transfer illustrated in FIG. 11 corresponds to straight paths, it should be noted that the data transferred to different regions of the sector-aligned memory 92 may use a variety of directions and routes. It should be noted that other suitable circuits may also be employed to transfer the data in accordance with the embodiments presented herein.

As shown in FIGS. 10 and 11, the sector controller (SC) 58 may initiate a transfer of data directly between memory locations within the base die 24 using the NOC system 100. In this case, the sector controller (SC) 58 may act as the master to initiate the transfer, but then the transfers would be performed directly in the sector-aligned memory 92 and the NOC system 100 of the base die 24 after the sector controller (SC) 58 initiates the transfer. It should also be mentioned that, in some embodiments, that the sector controller (SC) 58 and similar components of the fabric die 22 may also initiate the components (e.g., memory control circuitry 93, non-user input control circuitry 94, non-user output control circuitry 95) of the base die 24 to perform transfers between the sector-aligned memory 92, the peripheral circuitry 28, and other components attached to the base die. As a result, data transfers may occur in the base die 24 without involvement of components in the fabric die 22.

In certain embodiments, the NOC system 100 may also enable the programmable logic device 12 to provide security isolation for one or more of the programmable logic sectors 48. That is, the NOC system 100 may be employed to communicate certain sensitive or secure data to a portion of programmable logic sectors 48 that may be designated as a security portion of the programmable logic device 12. Third party programmers may be unable to access the security portion of the programmable logic device 12 without access to the NOC system 100. Instead, the NOC system 100 may be limited to communication by certain programmers with a level of security credentials.

Figure 12:
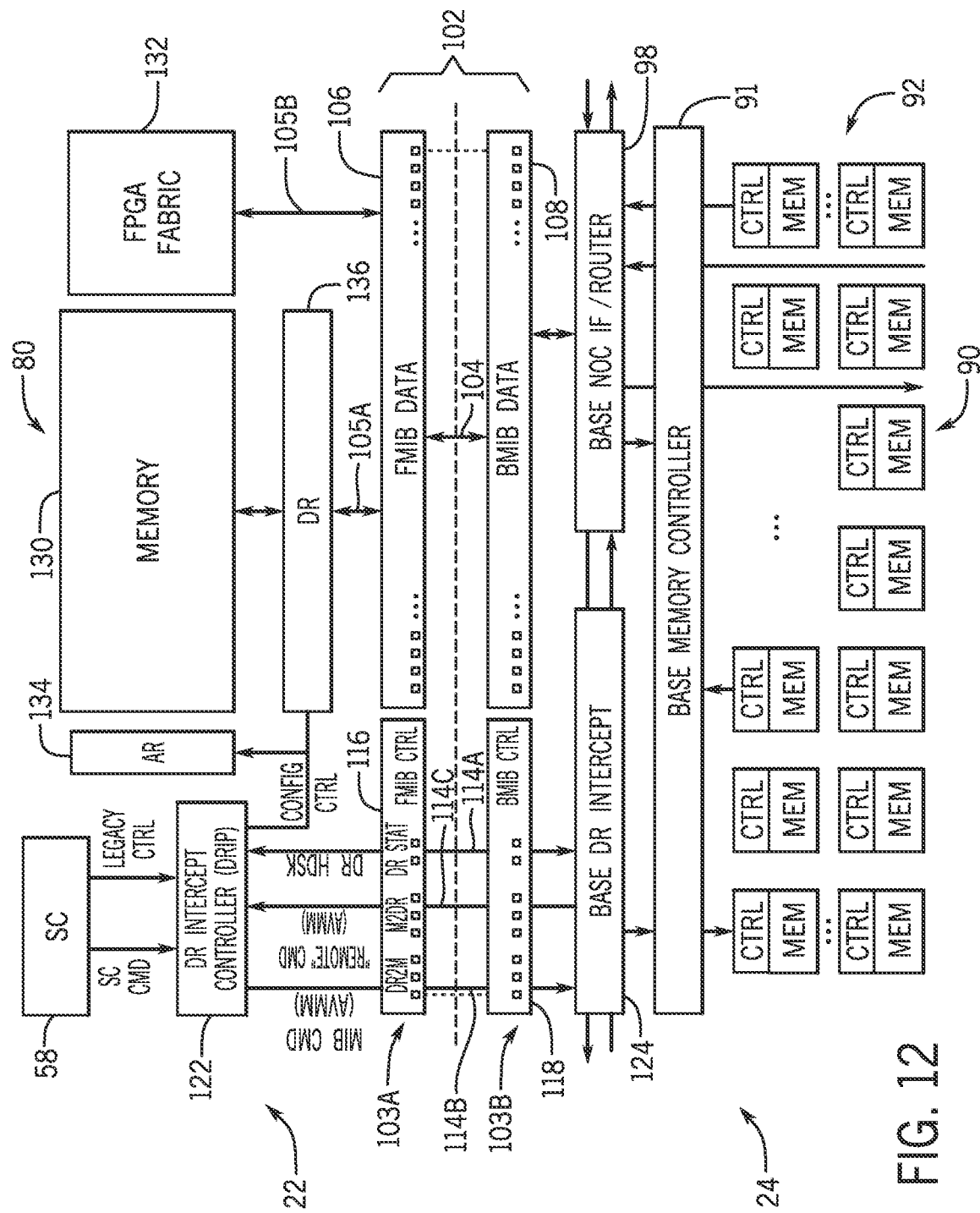
FIG. 12 is a block diagram illustrating a multi-purpose parallel configuration interface to exchange data between embedded memory or programmable fabric in the programmable logic die and the circuitry in the base die, in accordance with an embodiment.

With this in mind, FIG. 12 illustrates one embodiment in which a base die 24 may exchange data with the fabric die 22 via a high-speed parallel interface (e.g., microbump interface 102). The microbump interface 102 may couple the base die 24 and/or the fabric die in a sector-to sector level. For example, a sector 80 in the fabric die 22 may be coupled to a corresponding sector 90 in the base die. The sector 80 of the fabric device may include a sector controller 58, a fabric memory 130, which may be a configuration memory (CRAM) which may include configuration memory 52 and/or user memory 53. Sector 80 may also include FPGA fabric 132, which may include programmable logic elements 50. In some embodiments, read and/or write access to the memory may be performed with the assistance of an address register (AR) 134 and/or a data register (DR 136). The AR 134 and the DR 136 may be used to load data into the fabric memory 130 and/or retrieving data from the fabric memory 130. In some embodiments, the exchange between the fabric memory 130 and the microbump interface 102 may employ the DR 136.

The microbump interface 102 may occupy a row or column of a fabric sector 80 and a portion of base die sector 90. The microbump interface 102 may include interface circuitry in the fabric die 22 (e.g., FMIB 103A) and in the base die 24 (e.g., BMIB 103B). The FMIB 103A and the BMIB 103B may be connected via a high-speed microbump interconnect. The FMIB 103A may include a data exchange block FMIB DATA 106 and a control block FMIB CTRL 116. The BMIB 103B may include a data exchange block BMIB 108 and a control block BMIB CTRL 118. As detailed below, control and command for data operations may be exchanged between control blocks FMIB CTRL 116 and BMIB CTRL 118, and data transfer for the respective commands may be exchanged between data exchange block FMIB 106 and BMIB 108.

The microbump interface 102 may receive or transmit data via a datapath 104, that may be established between a data exchange block FMIB DATA 106 of the FMIB 103A and a data exchange block BMIB DATA 108 of the BMIB 103B. The data exchange blocks FMIB 103A and BMIB 103B may be coupled through multiple channels, and may be coupled to each other via a microbump interconnect, as discussed herein. In some embodiments, the datapath 104 may be grouped into source synchronous channels (e.g., data is transmitted with clock signal) with individually centered clocks to maximize micro-bump bandwidth. The interface clocking may be used to facilitate communications and data transfer may be clocked using a single data rate (SDR) clocking, a double data rate (DDR) clocking, a quad data rate (QDR) clocking, or a xY interface clocking. The microbump clocking may be x2, x4 or xY faster with narrower data width (/2, /4 or/Y) compared to the internal wider data buses. Based on microbump design requirements, the microbump clock may be single ended or differential clocking. Data microbumps in the datapath 104 may employ unidirectional RX and/or TX channels or common bi-directional channels.

The microbump interface 102 may also exchange control and/or data signals through a control interfaces 114A, 114B, and 114C. The control interfaces may be established between control block FMIB CTRL 116 of the FMIB 103A and a control block BMIB CTRL 118 of the BMIB 103B. The control interfaces 114A, 114B, and 114C may be used to coordinate operations between the DRIP controller 122 in the fabric die 22 and the DRIP controller 124 in the base die 24. The control interfaces 114A, 114B, and 114C may coordinate operations to facilitate exchanges of data between the fabric memory 130, the sector-aligned memory 92 of the base die 24, and/or the NOC system 100 via the NOC router 98. Moreover, it should be noted that remote requests to the microbump interface 102 may arrive via the NOC system 100 in the base die, as detailed below. Moreover, as discussed above, the base die 24 may have additional resources, including vector engines, compute-in-memory, and other circuitry that may generate and/or receive data, and the microbump interface 102 may be used to exchange data between such circuitry and the fabric memory 130. As with the datapath 104, control interfaces 114A, 114B, and 114C may be source synchronous channels with individually centered clocks to maximize micro-bump bandwidth. The interface clocking may be clocked using a single data rate (SDR) clocking, a double data rate (DDR) clocking, a quad data rate (QDR) clocking, or a xY interface clocking. Based on microbump design requirements, the microbump clock may be single ended or differential clocking. Control microbumps for control interfaces 114A, 114B, and 114C may be unidirectional or bi-directional, as detailed below.

As discussed above, the DRIP controllers 122 and 124 may be implemented using a state machine that may be triggered by events. Events of the state machine may be associated with signals exchanged in the control interfaces 114A-C. The Table 1 illustrates examples of signals that may be used to perform commands and/or functions using the microbump interface 102. It should be understood that the this Table 1 is a non-limiting illustrative example of certain features in an embodiment of the microbump interface 102, and that variations and/or extensions to this example are contemplated by this disclosure. Data microbumps for control interfaces 114A-C may employ unidirectional RX and/or TX channels or common bi-directional channels. In some embodiments, the control interface may operate in an asynchronous manner.

TABLE 1

Example of control protocol used to operate microbump interface 102

| Interface | Description |
|---|---|
| Control interface 114A | Control interface 114A may be used to communicate with handshake protocols between the DRIP controller 122 and the DRIP controller 124. DRIP controller 122 may indicate the sector 80 is ready for DRIP interface operations with a "Ready" signal. DRIP controller 124 may indicate completion status for DRIP interfaces with a "Status" signal. The "Status" signal may include additional coding and, as such, control interface 114A may be implemented using a single or multi-bit bus. |

TABLE 1-continued

Example of control protocol used to operate microbump interface 102

| Interface | Description |
|---|---|
| Control interface 114B | Command from DRIP controller 122 to controller 124. May be used to request a configuration operation to controller 124. This may be a memory-mapped interface over micro-bumps to push a command to a queue or first-in first-out (FIFO) buffer on the base die 24. A direct command interface may also be used. |
| Control interface 114C | Command from DRIP controller 124 to DRIP controller 122. The command may be a remote command from another sector 80 for a write or read operation. The remote command interface may be used to push a remote DRIP interface command coming via a NOC interface. This may be a memory-mapped interface over micro-bumps to push a command to a queue from the base die 24 to the fabric die 22. A direct command interface may be used. |

The DRIP controller 122 in the fabric die may operate in coordination with the sector controller 58. To that end, DRIP controller 122 may receive instructions from sector controller 58 and/or control the circuitry in the fabric sector 80, and provide instructions to the AR 134 and the DR 136. For example, DRIP controller 122 may receive commands from the sector controller 58 that may be associated with management of the microbump interface 102. In such situation, DRIP controller 122 may generate signals for the appropriate control interfaces 114A-C. As discussed above, the microbump interface 102 may also receive commands from remote circuitry (e.g., circuitry in other sectors or in a different die) via the NOC system 100. In such situation, the DRIP controllers 122 and 124 may arbitrate the remote requests and the sector control requests.

In some situations, the sector controller 58 may provide a legacy command that does not account for operations using the microbump DRIP interface 105A. In such situations, the DRIP controller 122 may generate commands (e.g., override commands) that control the AR 134 and the DR 136 based on operations that employ the DRIP interface 105A. For example, a sector controller 58 may request loading of configuration data to the fabric memory 130 from data coming from a legacy interface. In such situation, the DRIP controller 122 may, in coordination with the DRIP controller 124, pull the data from the legacy interface and store in the sector-aligned memory 92 for caching purposes, and load the configuration data to the fabric memory 130 via the microbump interface 102 through the DRIP interface 105A. The sector-aligned memory may be controlled by a base memory controller.

Figure 13:
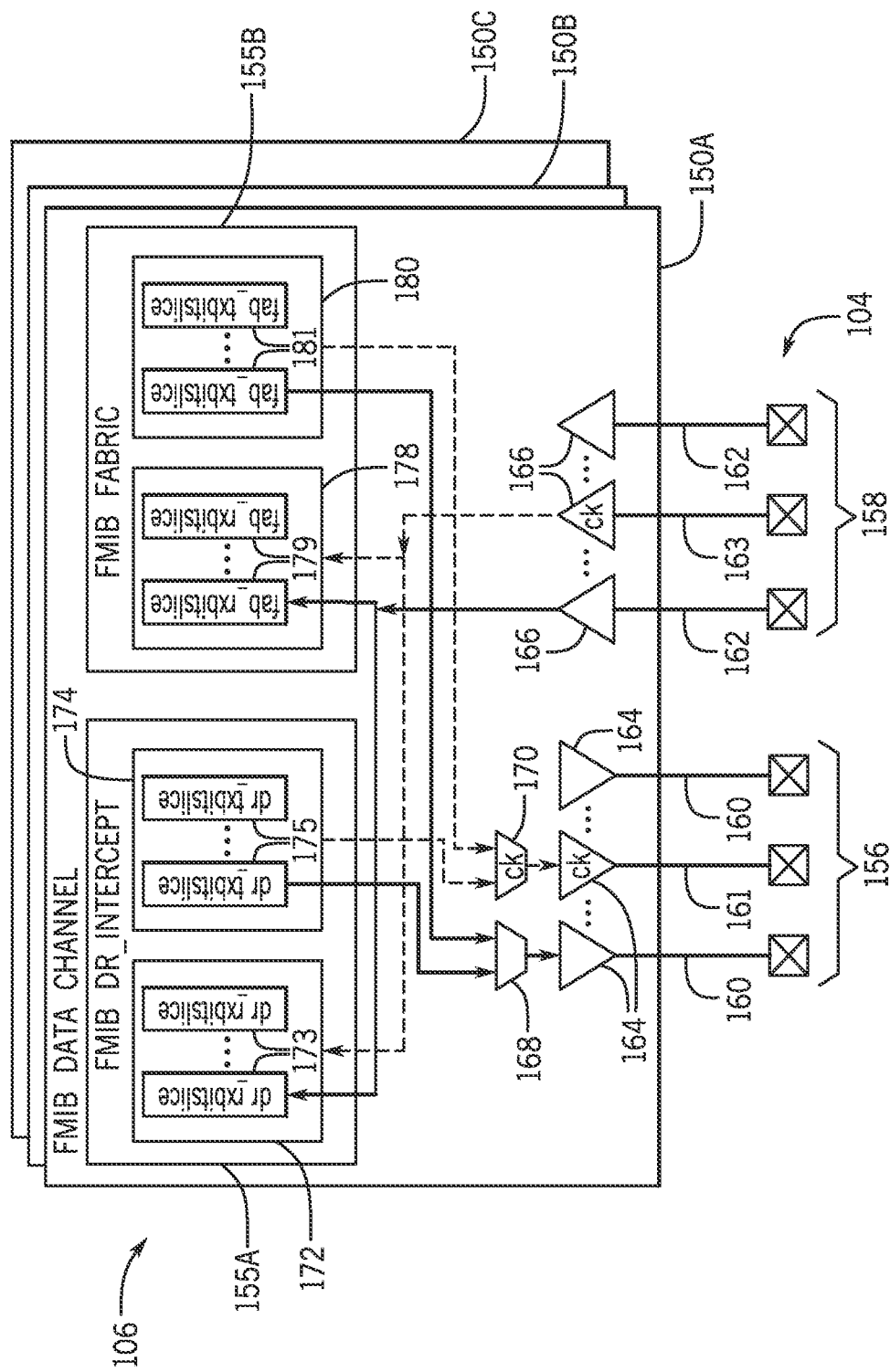
FIG. 13 is a block diagram illustrating multiple channels on a fabric die that may be used by a multi-purpose parallel interface, in accordance with an embodiment.
Figure 14:
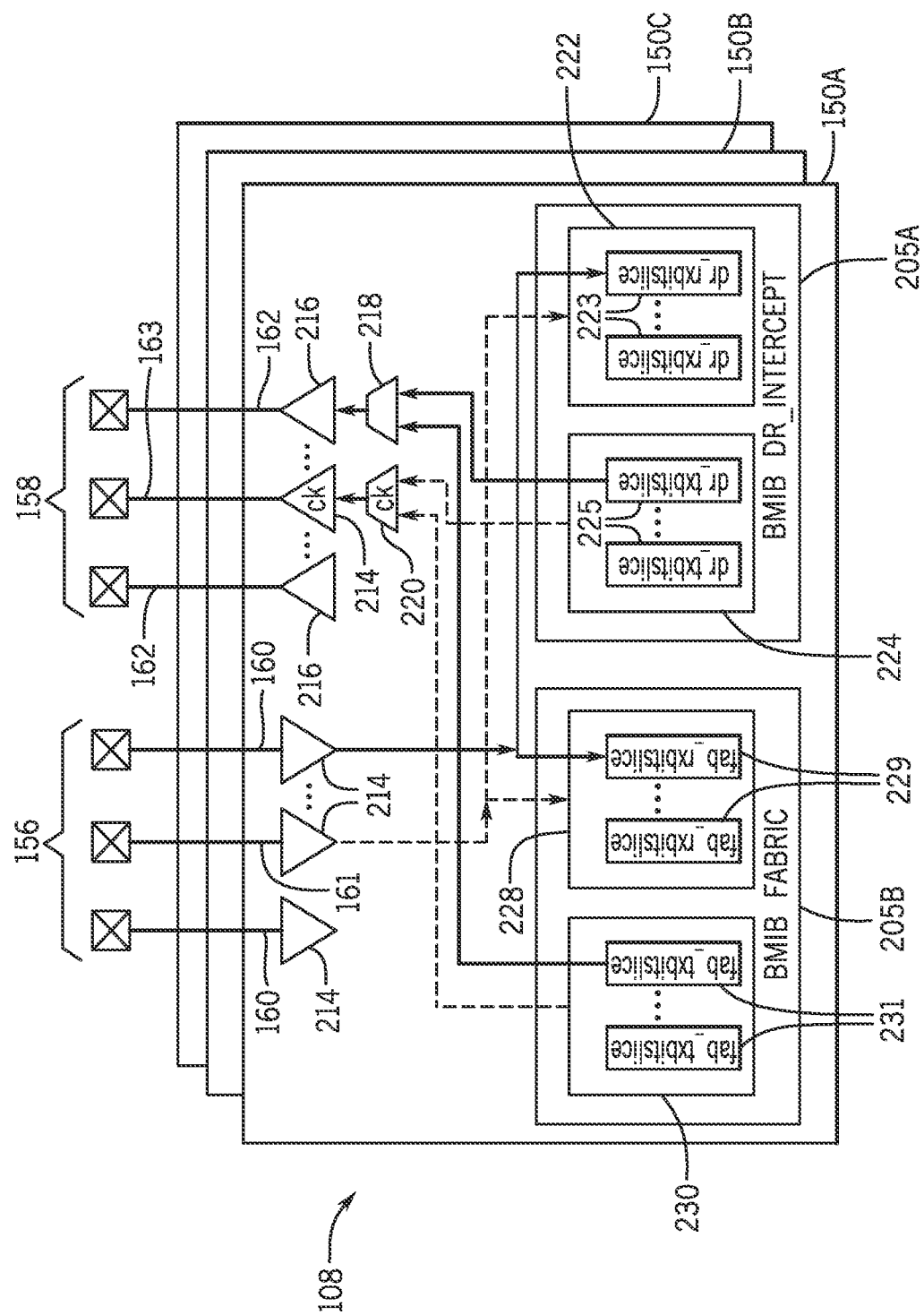
FIG. 14 is a block diagram illustrating multiple channels on a base die that may be used by a multi-purpose parallel interface, in accordance with an embodiment.

As discussed above, the microbump interface 102 may implement multiple channels to allow data transference between a base die 22 and a base die 24. FIGS. 13 and 14 illustrate the interfaces that may be used to perform the data exchange, including coordination for transport of configuration data and/or fabric data. The sector controller 58 may assign any channel of the microbump interface 102 to transport configuration data and/or fabric data. FIG. 13 illustrates an implementation for the interface block FMIB DATA 106 that may have multiple channels 150A, 150B, and 150C, and FIG. 14 illustrates an implementation for the interface block BMIB DATA 108 that may connect to the multiple channels 150A, 150B, and 150C. The channels 150A, 150B, and 150C may be coupled through datapath 104. The datapath 104 may have a first set of data signals 156 (e.g., microbump data signals) which may be unidirectional links from FMIB DATA 106 to BMIB DATA 108, and a second set of data signals 158, which may be unidirectional links from BMIB DATA 108 to FMIB DATA 106. Accordingly, the datapath 104 may be in half-duplex mode (e.g., bi-directional) when bound to the channels. In some embodiments, all the channels may use a common number of data bits (e.g., the number of data signals 156 and data signals 158 may be the same for all channels). It should be noted that, while the number of data bits used may be common, each channel may employ a different data transfer rate by employing bitslicing and/or managing clocking signals, as detailed below.

The FMIB DATA 106 illustrated in FIG. 13 may implement channels 150A, 150B, and 150C. Each channel may be accessed by the DRIP interface 105A via DRIP block 155A, and the fabric data interface 105B via fabric data block 155B. Each channel 150A-C may employ microbump I/O transmit buffers 164, which may be coupled to outgoing data lines 160 and outgoing clock lines 161 of the set of data signals 156. Access to the outgoing data lines 160 may be controlled by a multiplexer 168 and access to the outgoing clock lines 161 may be controlled by a multiplexer 170. The local sector controller 58 may control the multiplexers 168 and/or 170. Each channel 150A-C may employ microbump I/O receive buffers 166 that may be coupled to incoming data lines 162 and incoming clock lines 163

The DRIP block 155A may include a receive block 172 and a transmit block 174. The receive block 172 may receive data from the incoming data lines 162 and a clock signal from the clock line 163. The receive block 172 may have one or more RX bitslice blocks 173, that may be used to convert signal from the narrower (e.g., /1, /2, /4, /Y) width of the high-speed microbump channel (e.g., width of the portion of the datapath 104 bound to the channel 150A-C) to the wider width of the relatively slower speed internal DRIP interface 105A. For example, the signals of the channel 150A in the microbump interface 102 may be operating using a 32 bits bus at 1 GHz and the DRIP interface 105A may employ an internal bus that operates using 128 bits at 250 MHz to provide a common data rate. The RX bitslice blocks 173 may be used to perform buffering and/or queueing associated with the bandwidth matching operation. More generally, the RX bitslice blocks 173 may convert data in a width of the internal data bus (e.g., data bus of the DRIP interface 105A) to the width of the datapath 104 by choosing a clock frequency division and buffering that may balance the data bandwidth. In some embodiments, each receive block 172 may have pairs of RX bitslice blocks 173 (e.g., 2, 4, 6 RX bitslice blocks) that may be used to accelerate the receiving process.

Similarly, the transmit block 174 of the DRIP block 155A may send data to outgoing data lines 160 and a clock signal to clock line 161. The transmit block 174 may have one more TX bitslice blocks 175, that may be used to convert the signal from wider data width of the DRIP interface 105A to the narrower data width of the channel (e.g., width of the portion of the datapath 104 bound to the channel 150A-C), as discussed above. The TX bitslice blocks 175 may be used to perform buffering and/or queueing associated with the bandwidth matching operation. More generally, the TX bitslice blocks 175 may convert data widths by choosing a frequency divider and/or multiplier and buffering that may balance the outgoing data rate. In some embodiments, each receive block 174 may have pairs of TX bitslice blocks 175 (e.g., 2, 4, 6 RX bitslice blocks) that may be used to accelerate the transmit process.

The fabric data block 155B may include a receive block 178 and a transmit block 180. The receive block 172 may receive data from the incoming data signals 162 and a clock signal from the clock line 163. The receive block 178 may have one more RX bitslice blocks 179, that may be used to convert signal from the narrower (e.g., /1, /2, /4, /Y) width of the high-speed channel (e.g., width of the portion of the datapath 104 bound to the channel 150A-C) to the wider width of the internal fabric data interface 105B, as discussed above. Similarly, the transmit block 180 of the fabric data block 155B may send data to outgoing data lines 160 and a clock signal to clock line 161. The transmit block 180 may have one more TX bitslice blocks 181, that may be used to convert the signal from wider data width of the fabric data interface 105B to the narrower data width of the channel (e.g., width of the portion of the datapath 104 bound to the channel 150A-C), as discussed above.

The RX bitslice blocks 179 and the TX bitslice blocks 181 may be used to perform buffering and/or queueing associated with the bandwidth matching operation. For example, the signals of the channel 150A in the microbump interface 102 may be operating using a 32 bits bus at 1 GHz and the fabric data interface 105B may employ an internal bus that operates using 256 bits at 125 MHz to provide a common data rate. The bitslice circuitry may providing clocking a buffering functionality to accommodate the differences in the widths. More generally, the RX bitslice blocks 179 and the TX bitslice blocks 181 may convert between data widths by choosing a clock frequency division and buffering that may balance the incoming and/or outgoing data rate. In some embodiments, bitslice blocks (e.g., RX bitslice blocks 179, TX bitslice blocks 181) may be arranged in pairs to accelerate the transmit process or the receive process.

The BMIB DATA 108 in the base die 24 may be configured using an architecture that may be similar in certain aspects to the FMIB DATA 106. The BMIB DATA 108 illustrated in FIG. 14 may implement channels 150A, 150B, and 150C, which may be accessed by circuitry in the base die 24, such as the DRIP controller 124, memory controller 91, or NOC router 98. The choice of the circuitry in the base die 24 associated with each channel 150A-C may be made based on the function being performed using the specific channel. As discussed above, a channel 150A-C may be assigned to the DRIP interface 105A, in which case BMIB DATA 108 may employ DRIP block 205A. A channel 150A-C may be assigned to the fabric data interface 105B, in which case BMIB DATA 108 may employ fabric data block 205B. Each channel 150A-C may employ microbump I/O receive buffers 214, which may be coupled to incoming data lines 160 and incoming clock lines 161 of the set of data signals 156. Each channel 150A-C may employ microbump I/O transmit buffers 216 that may be coupled to outgoing data lines 162 and outgoing clock lines 163. Access to the outgoing data lines 162 may be controlled by a multiplexer 218 and access to the outgoing clock lines 161 may be controlled by a multiplexer 220. The local sector controller 58 may control the multiplexers 218 and/or 220.

The DRIP block 205A may include a receive block 222 and a transmit block 224. The receive block 222 may receive data from the incoming data lines 160 and a clock signal from the clock line 160. The receive block 222 may have one or more RX bitslice blocks 223, that may be used to convert signal from the narrower width of the channel (e.g., width of the portion of the datapath 104 bound to the channel 150A-C) to the wider width of the base die circuitry (e.g., width of the DRIP controller 124, memory controller 91, NOC router 98). Similarly, the transmit block 224 of the DRIP block 205A may send data to outgoing outlines 162 and a clock signal to clock line 162. The transmit block 224 may have one more TX bitslice blocks 225, that may be used to convert the signal from data width of the base die circuitry to the data width of the channel (e.g., width of the portion of the datapath 104 bound to the channel 150A-C), as discussed above. More generally, the RX bitslice blocks 223 and the TX bitslice blocks 225 may be used to perform buffering and/or queueing associated with the bandwidth matching operation, by performing a clock frequency adjustment and buffering that may balance the data rate through BMIB DATA 108.

Similarly, the fabric data block 205B may include a receive block 228 and a transmit block 230. The receive block 222 may receive data from the incoming data lines 160 and a clock signal from the clock line 161. The receive block 228 may have one more RX bitslice blocks 229, that may be used to convert signal from the width of the channel (e.g., width of the portion of the datapath 104 bound to the channel 150A-C) to the width the base die circuitry, as discussed above. Similarly, the transmit block 230 of the fabric data block 225B may send data to outgoing outlines 162 and a clock signal to clock line 163. The transmit block 230 may have one more TX bitslice blocks 231, that may be used to convert the signal from data width of the base die circuitry to the data width of the channel (e.g., width of the portion of the datapath 104 bound to the channel 150A-C). As discussed with respect to other bitslice circuitry, the RX bitslice blocks 229 and the TX bitslice blocks 231 may be used to perform buffering and/or queueing associated with the bandwidth matching operation. Moreover, as discussed above, the bitslice blocks (e.g., RX bitslice blocks 223 and 229, TX bitslice blocks 225 and 231) may be arranged in pairs to provide local pipelining and accelerate the transmit process.

Each channel 150A-C may be assigned to the DRIP interface 105A or the fabric data interface 105B by programming of the multiplexers 168, 170, 218, and/or 220. The programming of the multiplexers may be used to control access of the transmit blocks (e.g., 174, 180, 224, 230) to the data lines. The receive blocks (e.g., receive blocks 172, 178, 222, 228) may receive fanned-out data from the buffers (e.g., buffers 166, 214), and may be enabled based on the selected assignment. In some embodiments, this assignment may be pre-programmed (e.g., static, not accessible in user mode) or reconfigurable (e.g., accessible in user mode). In some embodiments, the assignment may be made prior to operation (e.g., configured using configuration data) or adjustable in runtime. For example, a channel 150A-C may be assigned to the DRIP interface 105A during a reprogramming period and, following the reprogramming task, re-assigned to the fabric data interface 105B in non-user mode. In another example, a channel 150A-C may be initially assigned to the fabric data interface 105B, re-assigned, in user mode, to the DRIP interface 105A to allow a transfer of data between the base die 24 and user memory (e.g., ERAM, M20K), and returned to the fabric data interface 105B for further processing.

In some embodiments, the bitslice blocks may be shared by the DRIP interface 105A or the data interface 105B. For example, in some embodiments, a single block, similar to DRIP block 155A or fabric data block 155B, and having a receive block (e.g., receive block 172 or receive block 178) and a transmit block (e.g., transmit block 174 or transmit block 180), may be accessed by both the DRIP interface 105A and the data interface 105B. In such system, a multiplexer may be used to manage the block assignment. The flexible distribution of bitslice blocks may allow optimization of the interface in view of the physical floorplan, the number of wires, and/or the logical protocols in the application.

The clock lines (e.g., clock lines 161 and 163) may provide clock signals that may be centered with the data bits of the data signals in the data lines (e.g., data lines 160 and 162). That is, a triggering feature (e.g., an edge) of the clock signal may be aligned with a center of the data. Careful balancing of the clock signals and data bits may decrease the bit-to-bit skew of the source synchronous transmit or receive data buses of the channel. Such implementation may decrease the bit-to-bit skew between multiple data lines. The clock signals may be single ended or differential. Moreover, as the clock lines are multiplexed and, thus, independent, different channels 150A-C may operate at different data rates using different clock frequencies and/or modes (e.g., single data rate (SDR), double data rate (DDR), or quad data rate (QDR)). Circuitry in different channels (e.g., multiplexers, bitslicing blocks, and buffers) may be shared by the different channels 150A-C. Similarly, a single channel may be accessed by more than one interface and each interface may have a bitslicing block configured to different data rates. As an example, a physical channel may be shared by a configuration data interface (e.g., DRIP interface 105A) and a fabric data interface (e.g., fabric data interface 105B) operating at different data rates.

Figure 15:
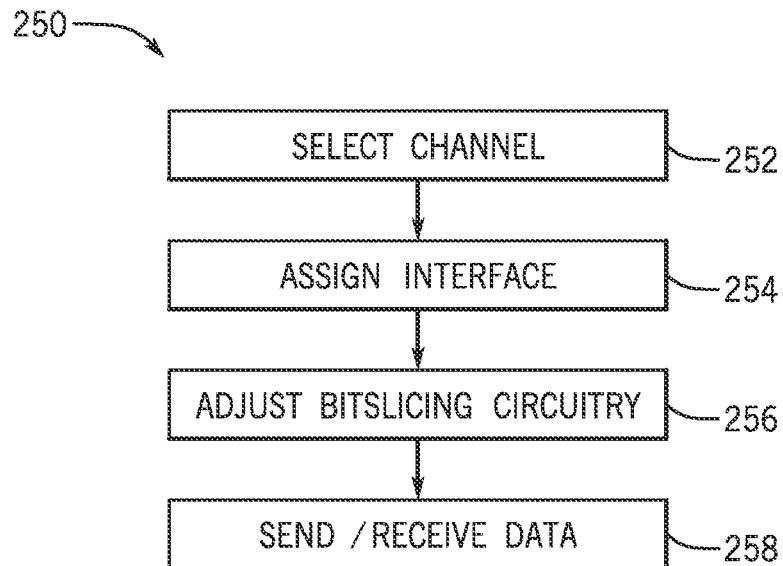
FIG. 15 is a flow chart of a method to use multiple channels using a multi-purpose interface, in accordance with an embodiment.

With the foregoing in mind, FIG. 15 illustrates a method 250 to exchange data employing the multi-purpose interface (e.g., microbump interface 102) discussed herein. In process block 252, a channel may be selected. The channel may be selected from available channels. In process block 254, the channel may be assigned to an interface. The interface may be a configuration data interface (e.g., DRIP interface 105A) or a fabric data interface (e.g., fabric data interface 105B). Assignment of the interface may include enabling and/or disabling of logic blocks associated with the interfaces and/or programming of multiplexers, as discussed above. In some embodiments, the multiplexers may be programmed by the local sector controller (e.g., sector controller 58). In process block 256, bitslice circuitry may be programmed. It should be noted that process blocks 254 and 256 may be executed at the same time. As discussed above, the bitslice blocks may be adjusted based on the data rate of the data path and a width of the internal bus. In a process block 258, data exchange may be initiated using the selected channel.

Figure 16:
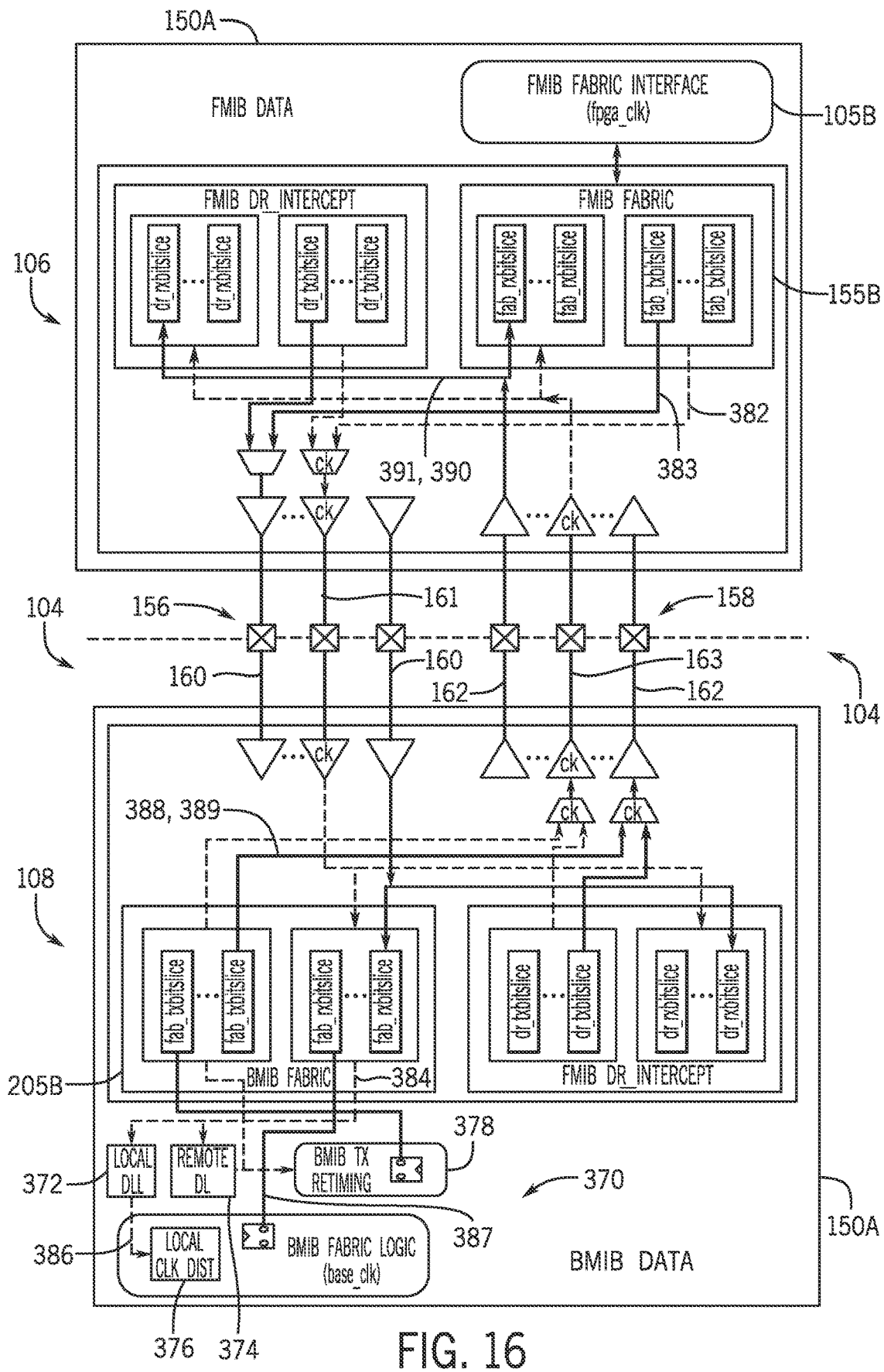
FIG. 16 is a block diagram illustrating a retiming process that may facilitate the use of a multi-purpose parallel interface, in accordance with an embodiment.

In order to perform fully synchronous read/write operations between circuitry in the fabric die 22 and the base die 24, a clocking mechanism that may allow for synchronous round-trip timing may be used. The clocking mechanism may perform retiming in the base die 24 based on the incoming clock signals. An example of an embodiment of retiming circuitry 370 that may be used is illustrated in FIG. 16. FIG. 16 illustrates communication between a FMIB DATA 106 and a BMIB DATA 108 using channel 150A. In the illustrated example, the channel 150A may be assigned to the fabric data interface 105B, and therefore fabric data blocks 155B and 205B may be active while DRIP blocks 155A and 205A may be disabled. Retiming circuitry 370 may include a local delay locked loop (DLL) 372 and a remote delay line 374. The retiming circuitry 370 may be used to generate a local clock 376 that may be used to clock the source synchronous data received in the base die. Moreover, the retiming circuitry 370 may be used to generate a programmable delay to the clock to align the return data to the fabric die clock using the TX data retiming block 378. As a result, the retiming circuitry 370 may be used to generate synchronous bi-directional operations between the fabric die 22 and base die 24.

In this source synchronous bi-directional operation, outgoing data signal 383, clocked to clock signal 382, may be synchronous to incoming data 391, which is represented as clocked to a virtual clock signal 390. To that end, the DLL 372 may phase align the local clock 376 to the received clock 384. The local clock 376 may then synchronously sample the incoming RX bitslice data 387. The local clock 376 may be used to clock the base die fabric logic. As the local clock 376 is trained by the clock signal 384, the base die fabric logic may synchronously sample the input (e.g., in a source synchronous manner). Moreover, the remote delay line 374 may be programmed based on the clock signal 384 of the incoming data to time the operations of the TX bitslice of the fabric data block 205B. The retiming of the clock signal may be used to emulate the latency in the return communication (e.g., from base die 24 to fabric die 22). In some embodiments, the use of retiming circuitry 370 may allow the clock line 163 to be inactivated, as the outgoing and incoming data may be effectively synchronized.

Figure 17:
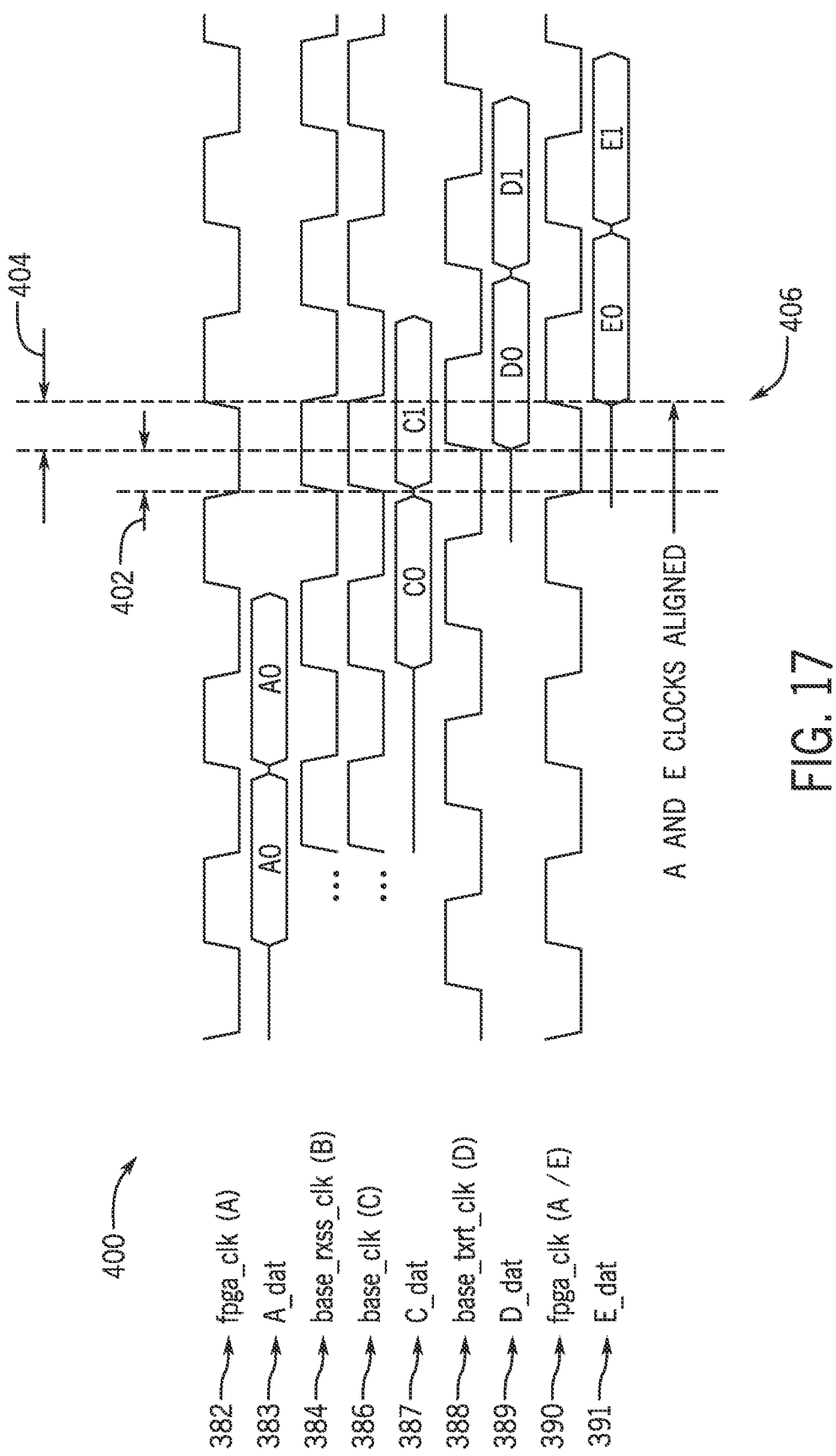
FIG. 17 is a timing diagram illustrating a process of retiming, in accordance with an embodiment.

The time chart 400 of FIG. 17 illustrates the retiming operation performed by retiming circuitry 370. Curves in FIG. 17 may refer to signals indicated in FIG. 16. It should be noted that clock signal 390 may refer to implicit clocks. That is, while no clock signal associated with clock signal 390 may be generated, data signal 391 may be synchronized to it. Clock signal 382 and data signal 383 may be provided by the fabric data interface 105B to the base die circuitry. Due to latencies in the datapath 104, the base die may receive a clock signal 384. The clock signal 384 may be used by the DLL 372 to generate a local clock signal 386 that may be locked to the fabric clock. In some embodiments, the DLL 372 may perform phase locking between the local clock 386 and the received clock 384.

The local clock signal 386 may be used to perform local clocking of the source synchronous received data. The clock signal 384 may also be used by the delay line 374 to determine a delay 402 that may be incorporated to the return data to and generate return data synchronization, as discussed above. The delay 402 may be calculated using the line latency 404. As such, the remote delay line 374 may incorporate the delay 402 to the clock signal 384 to generate the delayed clock signal 388. The TX data retiming block 378 may use the delayed clock to launch the TX return data. Due to the line latency 404, the returned data 391, implicitly synchronized to clock signal 390, may be aligned with the clock signal 382 at the fabric data interface 105B.

Figure 18:
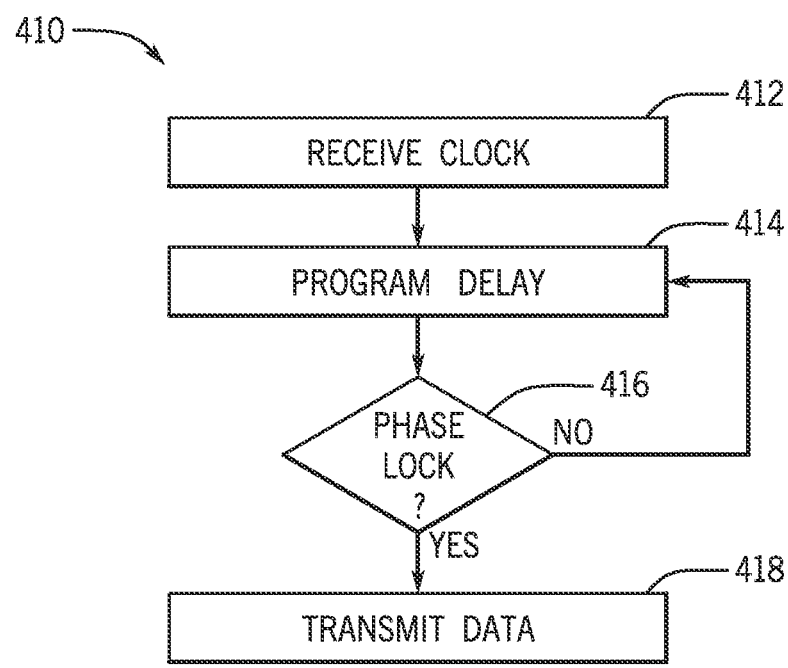
FIG. 18 is a flow chart of a method to perform retiming during the use a multi-purpose parallel interface, in accordance with an embodiment.

With the foregoing in mind, FIG. 18 illustrates a method 410 for performing retiming based on a remote signal. In a process block 412, a data signal, clocked to a clock signal, may be received. In some embodiments, the clock signal may be a recovered clock signal from the data signal. In process blocks 414 and 416, the timing circuitry may program a delay line such that the return data to the fabric die becomes synchronous (e.g., remote training of the base die). To that end, in process block 414 the base die may program the delay line by incrementally increasing or decreasing the delay.

The delay element may be used to compensate for latencies in the data line and/or latencies in the transmission path and minimize the skew between outgoing data and incoming data in the fabric die. In process block 416, the phase synchronization may be verified. If the return data is not sampled correctly, the method 410 may return to the process block 414 to further adjust the delay line to continue the training process until the a valid data window is achieved. If necessary a sweep of delays values in the delay line may be employed to identify the center of the valid data window. The training process of the delay element to minimize the skew may be performed by a local sector controller. Once the training is done, by verifying a phase lock in process block 416, return data may be generated and synchronized to a clock generated from the delayed clock in process block 418. Accordingly, the data may be transmitted back to the sender of the remote data signal and may arrive at the sender synchronized with the transmitted data. It should be noted that in some embodiments, the circuitry 370 may have components in the fabric die 22 to facilitate training the return microbump channels.

Figure 19:
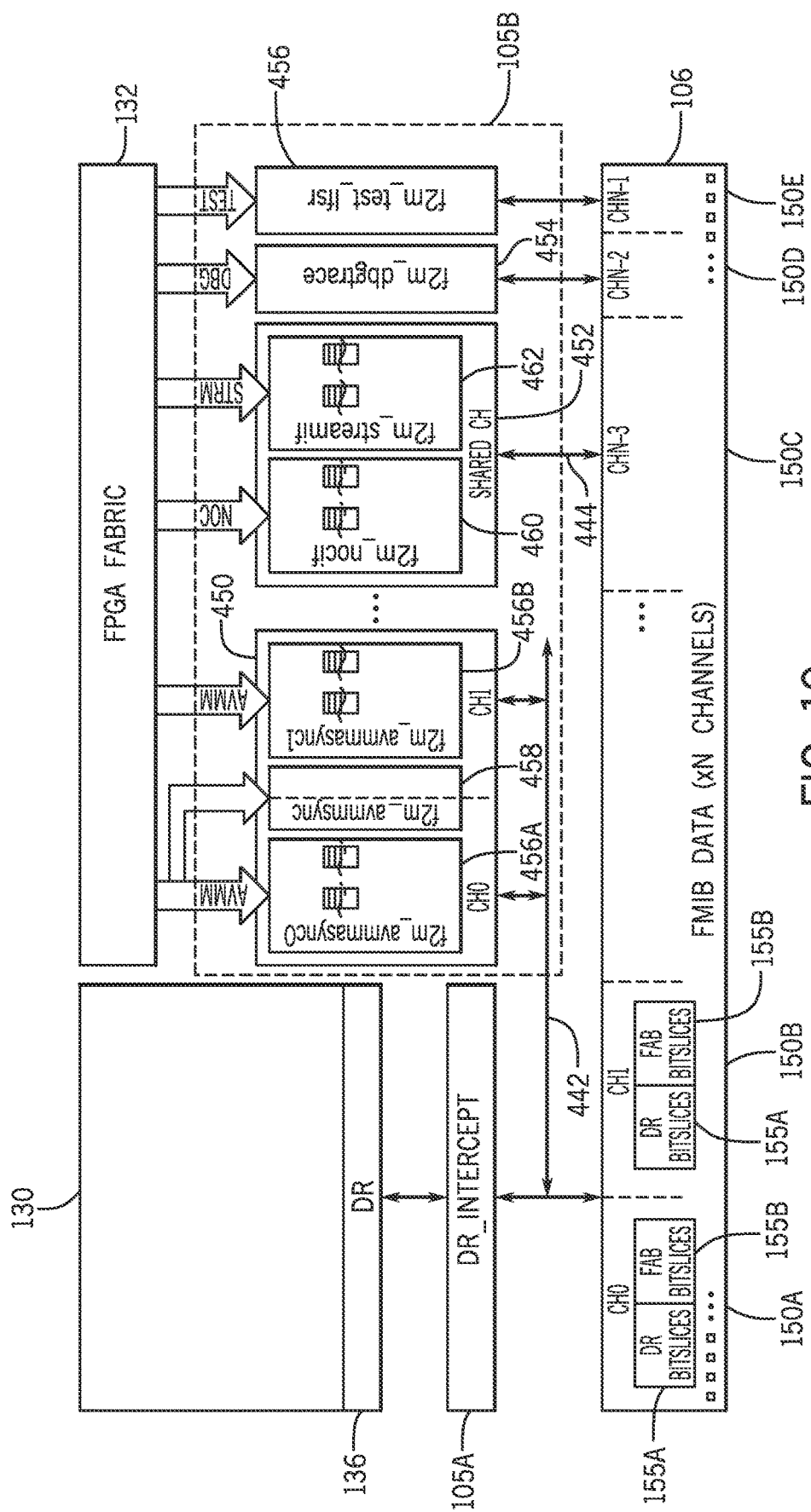
FIG. 19 is a block diagram illustrating the use of multiple protocols with the multi-purpose parallel interface, in accordance with an embodiment.

The fabric data interface 105B may allow multiple protocols to access the microbump interface 102, in a manner that employs different protocols simultaneously for different operations. To that end, the fabric data interface 105B may implement multiple protocol blocks. Protocol blocks may be implemented as hardened circuitry, custom circuitry, or soft IP blocks. The block diagram of FIG. 19 illustrates an example of a configuration of the microbump interface 102 that may be used to provide shared access of the microbump interface 102 to a DRIP interface 105A and to a fabric data interface 105B implementing multiple protocol blocks. FIG. 19 illustrates the FMIB DATA 106 coupled to the DRIP interface 105A and the fabric data interface 105B. The DRIP interface 105A may interact with the fabric memory 130 through the DR 136, as illustrated. The fabric data interface 105B may interact with the FPGA fabric 132. In the diagram, the fabric data interface 105B may include one or more fabric protocols that may intermediate the communication with multiple channels through protocols blocks 450, 452, 454, and 456.

The block diagram of FIG. 19, the FMIB DATA 106 is illustrated as having N channels 150A, 150B, 150C, 150D, and 150E. In the illustrated block diagram, only channels 150A and 150B are illustrated as having a DRIP bitslices block 155A and a fabric bitslices block 155B. It should be noted that all channels 150A-E may have a corresponding DRIP bitslices block 155A and fabric bitslices block 155B and, thus, may be accessible to the DRIP interface 105A and the fabric data interface 105B. As an example, the channels 150A and 150B may be shared by the DRIP interface 105A and the protocol block 450 in the fabric data interface 105B. Sharing may take place by enabling and disabling the DRIP block 155A and/or the fabric data block 155B, as discussed above. For example, when a programmable logic device is performing configuration operations (e.g., initial configuration, partial reconfiguration), channels 150A and 150B may be assigned to the DRIP interface 105A. When the programmable logic device is performing user mode operations, channels 150A and 150B may be assigned to the protocol block 450. In the illustrated example, protocol block 450 may implement a memory mapped protocol, which may have asynchronous components (e.g., block 456A and 456B) and/or synchronous components (e.g., block 458).

Protocol blocks of the fabric data interface 105B may also allow flow of different types of data (e.g., different protocols). For example, protocol block 452 may be a shared protocol block that provides access between the FPGA fabric 132 and the microbump interface 102 using a NOC block 460 and a streaming block 462. The protocol block 452 may provide shared access of blocks 460 and 462 to channel 150C. The diagram of FIG. 19 also illustrates a debug and trace protocol block 454 that may access channel 150D and a fabric test protocol block 456, that may access channel 150E. Generally, the protocols implemented in the fabric data interface 105B may be synchronous and/or asynchronous, and the data may be processed using a SDR, a DDR, a QDR, or any other clocking and/or triggering strategy, as discussed above. The clocking mode employed by the protocol blocks may be based on the application. In applications where low latency and/or fully synchronous operations may be of benefit, retiming strategies such as the ones discussed above may be employed.

As discussed above, the multi-purpose microbump interface 102 may allow multiple different functionalities for either the configuration data interface (e.g., DRIP interface 105A) and/or the fabric data interface (e.g., fabric data interface 105B). Tables 1 and 2 provide a non-limiting list of applications that may be implemented using the multi-purpose interface described herein.

TABLE 1

Operations employing configuration data interface (e.g., DRIP interface 105A).

| Operation Type | Function |
|---|---|
| Read/write configuration data | Fast parallel write or read of configuration memory (e.g., CRAM) to or from sector-aligned memory or NOC. May increase speed of configuration and/or partial reconfiguration. |
| Read/write user data | Fast parallel write or read of user memory (e.g., ERAM, M20K) to or from sector-aligned memory or NOC. May increase speed of partial reconfiguration and/or user memory context swapping. |
| FPGA Test | Fast parallel load of automated test pattern generation (ATPG) test vectors and/or data from using linear-feedback shift register (LFSR) circuitry from base circuitry and fast retrieval of test sequences for verification to base circuitry. |

TABLE 2

Operations employing fabric data interface (e.g., fabric data interface 105B).

| Operation Type | Function |
|---|---|
| Direct Memory Access | Fabric circuitry may directly access base die sectorized memory. |
| Memory Mapped Interfaces | Fabric may use memory-mapped interfaces to access base die sectorized memory, NOC circuitry, and/or other base die circuitry. Examples of memory-mapped interfaces include Avalon Memory Map (AVMM) or Advanced Microcontroller Bus Architecture (AMBA) Advanced Extensible Interface (AXI). |
| NOC | Fabric may directly access NOC circuitry using NOC interface. The NOC interface may have extended features including security domains, Quality of Service (QoS), and other network features. |
| Streaming | Fabric may push streaming data to the sectorized memory, or NOC circuitry, and/or other base die circuitry. This may employ a first-in first-out (FIFO) or a large memory buffer in the fabric. Streaming interfaces that may be mapped include an Avalon Streaming (AVST) or AMBA High-Performance Bus (AHB). |
| Debug and Trace | Fabric may use the sectorized memories or NOC as storage for debug and trace operations. Examples of debug and trace operations include SOC capture and trace buffers for debugging traditional software, FPGA storage for real time data capture to debug FPGA design (e.g., Signal Tap), and FPGA storage for real time ASIC emulation data. |
| Fabric Test | Fabric may load fast parallel test vectors from base memory or base LFSR circuitry and retrieve scan test data to base die circuitry for verification. Examples of fabric test operation include use of vectors that test scan chains in the programmable fabric, use of ATPG scan chains in ASIC emulation, use of traffic generators in the base die to verify ASIC prototypes in ASIC emulators, and the use of large numbers of LFSR circuitry to perform noise and/or stress tests. |
| Application Specific Interface | Base die may include circuitry that performs operations such as compute in memory, vector engines, or any other application specific use case. Either fabric may interact with this circuitry, directly or employing a memory mapped interface. |

Figure 20:
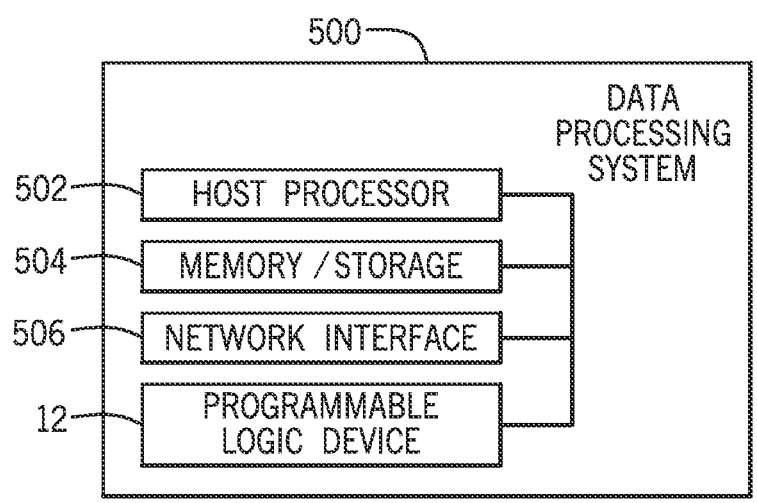
FIG. 20 is a block diagram of a data processing system that may use the programmable logic device to rapidly respond to data processing requests, in accordance with an embodiment.

The programmable logic device 12 may be a data processing system or may be a component of a data processing system. For example, the programmable logic device 12 may be a component of a data processing system 500, shown in FIG. 20. The data processing system 500 includes a host processor 502, memory and/or storage circuitry 504, and a network interface 506. The data processing system 500 may include more or fewer components (e.g., electronic display, user interface structures, application specific integrated circuits (ASICs)). The host processor 502 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 500 (e.g., to perform machine learning, video processing, voice recognition, image recognition, data compression, database search ranking, bioinformatics, network security pattern identification, spatial navigation, or the like). The memory and/or storage circuitry 504 may include random access memory (RAM), read-only memory (ROM), one or more hard drives, flash memory, or the like. The memory and/or storage circuitry 504 may be considered external memory to the programmable logic device 12 and may hold data to be processed by the data processing system 500. In some cases, the memory and/or storage circuitry 504 may also store configuration programs (e.g., bitstream) for programming the programmable logic device 12. The network interface 506 may allow the data processing system 500 to communicate with other electronic devices. The data processing system 500 may include several different packages or may be contained within a single package on a single package substrate.

In one example, the data processing system 500 may be part of a data center that processes a variety of different requests. For instance, the data processing system 500 may receive a data processing request via the network interface 506 to perform machine learning, video processing, voice recognition, image recognition, data compression, database search ranking, bioinformatics, network security pattern identification, spatial navigation, or some other specialized task. The host processor 502 may cause the programmable logic fabric of the programmable logic device 12 to be programmed with a particular accelerator related to requested task. For instance, the host processor 502 may instruct that configuration data (bitstream) stored on the memory/storage circuitry 504 or cached in sector-aligned memory of the programmable logic device 12 to be programmed into the programmable logic fabric of the programmable logic device 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 500 in performing the requested task. Indeed, in one example, an accelerator may assist with a voice recognition task less than a few milliseconds (e.g., on the order of microseconds) by rapidly accessing and processing large amounts of data in the accelerator using sector-aligned memory.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . " it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An integrated circuit device comprising:
   a first die comprising a programmable logic fabric and first data exchange circuitry that is directly connected to the programmable logic fabric and a microbump interface; and
   a second die comprising:
      second data exchange circuitry that is directly connected to the microbump interface and exchanges data with the first data exchange circuitry via the microbump interface; and
      network on chip circuitry connected to the second data exchange circuitry and configurable to provide an interface for the first die to send data to or receive data from systems external to the first die and the second die.

2. The integrated circuit device of claim 1, wherein the microbump interface comprises a plurality of channels, wherein a channel of the plurality of channels is configurable to exchange configuration data with embedded memory of the first die and exchange fabric data with programmable logic fabric.

3. The integrated circuit device of claim 2, wherein the first die comprises fabric support circuitry that is configurable to receive first fabric data from the programmable logic fabric via the microbump interface and to transmit second fabric data to the programmable logic fabric via the microbump interface.

4. The integrated circuit device of claim 3, wherein the second die comprises retiming circuitry configurable to:
   receive a clock signal synchronized to the first fabric data;
   program delay circuitry of the second die based on at least in part on the clock signal to generate a return clock signal; and
   transmit the second fabric data to the programmable logic fabric sampled by the return clock signal.

5. The integrated circuit device of claim 4, wherein the retiming circuitry is configurable to generate synchronous bi-directional operations between the first die and the second die.

6. The integrated circuit device of claim 2, wherein the channel of the plurality of channels comprises a first block configurable to exchange the fabric data with the programmable logic fabric and a second block configurable to exchange the configuration data with the embedded memory.

7. The integrated circuit device of claim 6, wherein the channel of the plurality of channels comprises a multiplexer configurable to provide access from the first block or the second block to the microbump interface.

8. The integrated circuit device of claim 2, wherein: the first data exchange circuitry is coupled to a configuration data interface, and wherein the configuration data interface is coupled to the embedded memory via a data register.

9. The integrated circuit device of claim 8, wherein the first data exchange circuitry is coupled to a fabric data interface, and wherein the programmable logic fabric is directly coupled to the first data exchange circuitry via the fabric data interface.

10. The integrated circuit device of claim 8, wherein the channel of the plurality of channels is configurable to operate at a microbump data rate larger than an internal data rate of the first data exchange circuitry.

11. A method to reconfigure a programmable logic device, comprising:
   selecting for reassignment a channel of a microbump interface assigned to a fabric data interface that couples the microbump interface to programmable fabric, wherein the microbump interface couples to a first die having the programmable fabric and configuration memory and a second die having network on chip circuitry;

assigning the channel to a configuration data interface that couples the microbump interface to the configuration memory of the first die;

receiving a fabric configuration bitstream from the network on chip circuitry of the second die; and programming the programmable fabric by writing the fabric configuration bitstream to the configuration memory from the second die to the configuration memory through the channel.

12. The method of claim 11, comprising providing an interface, via the network on chip circuitry, for the first die to send or receive data or control signals from systems external to the first die and the second die.

13. The method of claim 11, comprising:
receiving, at the second die, first data from the programmable fabric via the microbump interface; and
transmitting, from the second die, second data to the programmable fabric via the microbump interface;
receiving, at a retiming circuitry of the second die, a source clock signal synchronized to the first data;
generating a return clock signal using a program delay circuitry of the second die based at least in part on the source clock signal; and
sampling the second data to the programmable fabric using by the return clock signal, and wherein the second data is received synchronously by the programmable fabric.

14. The method of claim 11, wherein a microbump data rate is larger than an internal data rate of a first interface circuitry of the first die.

15. The method of claim 14, wherein the channel is configurable to perform a clocking adjustment to match the internal data rate to the microbump data rate.

16. The method of claim 15, wherein the clocking adjustment comprises a double data rate (DDR) clocking, a quad data rate (QDR) clocking, a xY interface clocking, or any combination thereof.

17. An electronic device, comprising:
a first die that comprises:
programmable fabric;
configuration memory; and
first data exchange circuitry that is directly coupled to a microbump interface and the programmable fabric; and
a second die comprising:
second data exchange circuitry that is directly connected to the microbump interface and exchanges data with the first data exchange circuitry via the microbump interface; and
network on chip circuitry connected to the second data exchange circuitry and configurable to provide an interface for the first die to send or receive data from systems external to the first die and the second die.

18. The electronic device of claim 17, wherein:
the microbump interface comprises a plurality of channels configurable to exchange fabric data with the programmable fabric and to exchange configuration data with the configuration memory;
the first die comprises a plurality of protocol blocks; and
a protocol block of the plurality of protocol blocks is associated with at least one channel of the plurality of channels.

19. The electronic device of claim 18, wherein the plurality of protocol blocks comprises a direct memory access protocol block, a memory mapped interface protocol block, a streaming protocol block, a debug and trace protocol block, a fabric test protocol block, an application specific interface protocol block, or any combination thereof.

20. The integrated circuit device of claim 10, wherein the channel of the plurality of channels is configurable to perform a clocking adjustment to match the internal data rate to the microbump data rate.

* * * * *